United States Patent
Kuchenbeiser et al.

(10) Patent No.: US 9,777,373 B2
(45) Date of Patent: Oct. 3, 2017

(54) AMINO(IODO)SILANE PRECURSORS FOR ALD/CVD SILICON-CONTAINING FILM APPLICATIONS AND METHODS OF USING THE SAME

(71) Applicant: American Air Liquide, Inc., Fremont, CA (US)

(72) Inventors: Glenn Kuchenbeiser, Newark, DE (US); Bastien Lefevre, Wilmington, DE (US)

(73) Assignee: American Air Liquide, Inc., Fremont, CA (US)

( * ) Notice: Subject to any disclaimer, the term of this patent is extended or adjusted under 35 U.S.C. 154(b) by 0 days.

(21) Appl. No.: 14/984,866

(22) Filed: Dec. 30, 2015

(65) Prior Publication Data

US 2016/0115593 A1    Apr. 28, 2016

(51) Int. Cl.
| | |
|---|---|
| *C23C 16/455* | (2006.01) |
| *C23C 16/34* | (2006.01) |
| *C23C 16/56* | (2006.01) |
| *H01L 21/02* | (2006.01) |
| *C01B 21/068* | (2006.01) |
| *H01L 21/311* | (2006.01) |

(52) U.S. Cl.
CPC ...... *C23C 16/45553* (2013.01); *C01B 21/068* (2013.01); *C23C 16/345* (2013.01); *C23C 16/45536* (2013.01); *C23C 16/56* (2013.01); *H01L 21/0217* (2013.01); *H01L 21/0228* (2013.01); *H01L 21/02211* (2013.01); *H01L 21/02219* (2013.01); *H01L 21/02271* (2013.01); *H01L 21/02274* (2013.01); *H01L 21/31111* (2013.01)

(58) Field of Classification Search
None
See application file for complete search history.

(56) References Cited

U.S. PATENT DOCUMENTS

| | | | |
|---|---|---|---|
| 7,125,582 B2 | 10/2006 | McSwiney et al. | |
| 2008/0274605 A1* | 11/2008 | Hoshi | C23C 16/345 438/585 |
| 2012/0021127 A1 | 1/2012 | Sato et al. | |
| 2012/0277457 A1 | 11/2012 | Lehmann et al. | |

(Continued)

FOREIGN PATENT DOCUMENTS

| | | |
|---|---|---|
| JP | 2006 096675 | 4/2006 |
| WO | WO 2006 059187 | 6/2006 |
| WO | WO 2009 087609 | 7/2009 |
| WO | WO 2011 123792 | 10/2011 |
| WO | WO 2012 167060 | 12/2012 |

OTHER PUBLICATIONS

Anderson, D.G. et al., "Preparations, properties, and vibrational spectra of some (dimethylamino)halogenosilanes," J. Chem. Soc. Dalton Trans. 1987, 3029-3034.

(Continued)

*Primary Examiner* — Jiong-Ping Lu
(74) *Attorney, Agent, or Firm* — Patricia E. McQueeney; Yan Jiang

(57) ABSTRACT

Disclosed are amino(iodo)silane precursors, methods of synthesizing the same, and methods of using the same to deposit silicon-containing films using vapor deposition processes. The disclosed amino(iodo)silane precursors include $SiH_2I(N(iPr)_2)$ or $SiH_2I(N(iBu)_2)$.

7 Claims, 6 Drawing Sheets

(56) References Cited

U.S. PATENT DOCUMENTS

| | | |
|---|---|---|
| 2013/0078392 A1 | 3/2013 | Xiao et al. |
| 2013/0319290 A1 | 12/2013 | Xiao et al. |
| 2013/0323435 A1 | 12/2013 | Xiao et al. |
| 2014/0051264 A1 | 2/2014 | Mallick et al. |
| 2014/0273477 A1* | 9/2014 | Niskanen ............ H01L 21/0217 438/703 |
| 2014/0273528 A1 | 9/2014 | Niskanen et al. |
| 2014/0273531 A1 | 9/2014 | Niskanen et al. |

OTHER PUBLICATIONS

Cass, R. et al., "438. Dimethylaminochlorosilanes," J. Chem. Soc., 1952, 2347-2349.

Emsley, J., "Aminosilane-iodosilane adducts," J. Chem. Soc. (A), 1968, 1009-1-12.

Hassler, K. et al., "Synthese und Kemresonanzspektren von Bromdisilanen und Iodisilanen," J. Organometallic Chem., 398 (1990) 225-227 and English Abstract.

Passarelli, V. et al., "Aminolysis of the Si—Cl bond and ligand exchange reaction between silicon amido derivatives and $SiCl_4$: synthetic applications and kinetic investigations," Dalton Transl 2003, 413-419.

Schott, G. et al., "Kurze Originalmitteilungen. Über Dimethylamino-brom-silane," Z. Chem. 1 Jg., Heft 4, 1961, 123.

Stüger, H. et al., "Aminochlorodisilanes: precursors to multifuncionalized disilane derivatives," J. Organometallic Chem., 547 (1997) 227-233.

* cited by examiner

AMINO(IODO)SILANE PRECURSORS FOR ALD/CVD SILICON-CONTAINING FILM APPLICATIONS AND METHODS OF USING THE SAME

TECHNICAL FIELD

Disclosed are Si-containing film forming compositions, methods of synthesizing the same, and methods of using the same to deposit silicon-containing films using vapor deposition processes for manufacturing semiconductors, photovoltaics, LCD-TFT, flat panel-type devices, refractory materials, or aeronautics. The disclosed Si-containing film forming compositions comprise an amino(iodo)silane precursor selected from $SiH_2I(N(iPr)_2)$, $SiH_2I(N(iBu)_2)$, or combinations thereof.

BACKGROUND

Si-containing thin films may be used, for example, as dielectric materials having electrical properties which may be insulating ($SiO_2$, SiN, SiCN, SiCOH, $MSiO_x$, wherein M is Hf, Zr, Ti, Nb, Ta, or Ge and x is greater than zero), and also used as conducting films, such as metal silicides or metal silicon nitrides. Due to the strict requirements imposed by downscaling of electrical device architectures towards the nanoscale, especially below 28 nm node, increasingly fine-tuned molecular precursors are required which meet the requirements of volatility for atomic layer deposition (ALD) and chemical vapor deposition (CVD) processes, lower process temperatures, reactivity with various oxidants and low film contamination, in addition to high deposition rates, conformality and consistency of films produced.

Anderson et al. disclose preparation, properties and vibrational spectra of some dimethylaminohalogenosilanes, including $SiH_2I(NMe_2)$ (J. Chem. Soc. Dalton Trans. 1987, pp. 3029-3034). Anderson was not able to determine the melting point of the white solid because the sample exhibited some decomposition when warmed above room temperature. Id. at p. 3030.

Emsley discloses synthesis and analysis of several aminosilane-iodosilane adducts, which decomposed to form $H_2SiINEt_2$ or $H_2SiI$-piperidine.

Organoamino(halo)silanes have also been used as precursors for ALD/CVD of Si-containing films. U.S. Pat. No. 7,125,582 B2 to McSwiney et al. discloses the use of amino(halo)silanes for low-temperature silicon nitride deposition. Tris(dimethylamino)chlorosilane is disclosed in McSwiney et al.

WO2012/167060 to Xiao et al. discloses, among others, organoaminodisilane precursors having a formula of $R^8N(SiR^9LH)_2$ as a precursor, wherein L=Cl, Br, or I and $R^8$ and $R^9$ are each independently selected from the group consisting of hydrogen, $C_1$ to $C_{10}$ linear or branched alkyl, a C3 to C10 cyclic alkyl group, a linear or branched $C_2$ to $C_{10}$ alkenyl group, a linear or branched $C_2$ to $C_{10}$ alkynyl group, a $C_5$ to $C_{10}$ aromatic group, and a $C_3$ to $C_{10}$ saturated or unsaturated heterocyclic group.

Niskanen et al (US2014/0273528, US2014/0273531 and US2014/0273477) discloses, among others, mixed halo Si precursors having formula $H_{2n+2-y-z}Si_nX_yA_zR_w$ where X is I or Br, n=1-10, y=from 1 up to 2n+2-z-w, z=from 0 up to 2n+2-y-w, w=from 0 up to 2n+2-y-z, A is halogen other than X, and R is an organic ligand and can be independently selected from the group consisting of alkoxides, alkylsilyls, alkyl, substituted alkyl, alkylamines and unsaturated hydrocarbon. Exemplary precursors include $SiI_2H(NH_2)$, $SiI_2H(NHMe)$, $SiI_2H(NHEt)$, $SiI_2H(NMe_2)$, $SiI_2H(NMeEt)$, $SiI_2H(NEt_2)$, $SiI_2(NH_2)_2$, $SiI_2(NHMe)_2$, $SiI_2(NHEt)_2$, $SiI_2(NMe_2)_2$, $SiI_2(NMeEt)_2$, and $SiI_2(NEt_2)_2$.

US2012/0021127 to Sato et al. discloses a material for CVD containing an organic silicon-containing compound represented by formula: $HSiCl(NR^1R^2)(NR^3R^4)$, wherein $R^1$ and $R^3$ each represent $C_1$-$C_3$ alkyl or hydrogen; and $R^2$ and $R^4$ each represent $C_1$-$C_3$ alkyl.

US2012/0277457 to Lehmann et al discloses a haloaminosilane compound having the following formula: $X_{4-n}H_{n-1}SiN(CH(CH_3)_2)_2$ wherein n is 1, 2 and 3; and X is a halogen selected from Cl, Br, or a mixture of Cl and Br, including $Br_3SiNiPr_2$ US2013/0078392 to Xiao et al. discloses a composition for the deposition of a dielectric film comprising: $X_mR^1{}_nH_pSi(NR^2R^3)_{4-m-n-p}$, wherein X is a halide selected from the group consisting of Cl, Br, I, including $H_2ClSi(NR_2)$ or $HCl_2Si(NR_2)$, with R=Me, Et, iPr, sBu, iBu, cyclohexyl, pheny, perhydroquinoline, 2,6-dimethylpiperidino, and more.

Despite the wide range of choices available for the deposition of Si containing films, additional precursors are continuously sought to provide device engineers the ability to tune manufacturing process requirements and achieve films with desirable electrical and physical properties.

SUMMARY

Disclosed are Si-containing film forming compositions comprising an amino(iodo)silane precursor having the formula:

$$SiH_xI_y(NR^1R^2)_z \qquad (I)$$

wherein x+y+z=4; x=0, 1 or 2; y=1, 2 or 3; z=1, 2, or 3; $R^1$ and $R^2$ selected independently from $C_3$-$C_6$ alkyl, aryl, or hetero group; and $R^1$ and $R^2$ may be joined to form a nitrogen-containing heterocycle.

The disclosed Si-containing film forming compositions may have one or more of the following aspects:

x=2, y=1, and z=1;

the organoamino(iodo)silane precursor having the formula:

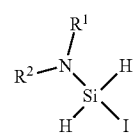

the organoamino(iodo)silane precursor being:

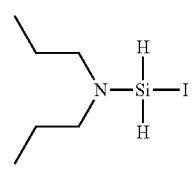

the organoamino(iodo)silane precursor being:

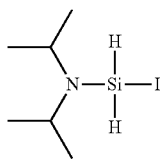

the organoamino(iodo)silane precursor being:

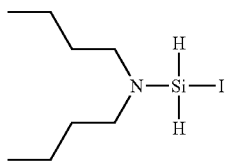

the organoamino(iodo)silane precursor being:

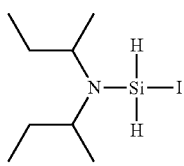

the amino(iodo)silane precursor being:

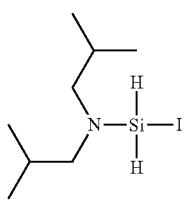

$R^1$ and $R^2$ being joined to form a cyclic nitrogen-containing heterocycle;
the amino(iodo)silane precursor being:

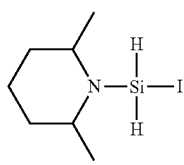

the amino(iodo)silane precursor being:

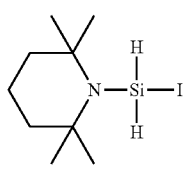

the amino(iodo)silane precursor being:

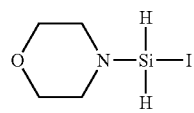

the amino(iodo)silane precursor being:

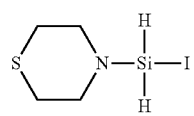

the amino(iodo)silane precursor being:

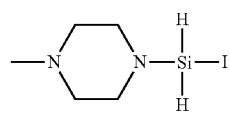

x=1, y=2, and z=1;
the amino(iodo)silane precursor having the formula:

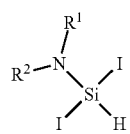

the amino(iodo)silane precursor being:

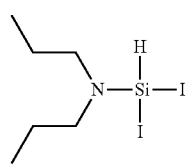

the amino(iodo)silane precursor being:

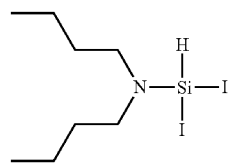

the amino(iodo)silane precursor being:

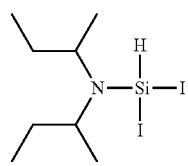

the amino(iodo)silane precursor being:

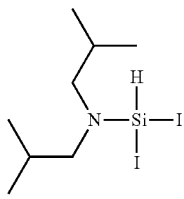

R¹ and R² being joined to form a cyclic nitrogen-containing heterocycle;
the amino(iodo)silane precursor being:

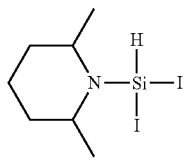

the amino(iodo)silane precursor being:

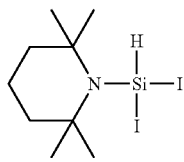

the amino(iodo)silane precursor being:

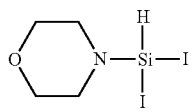

the amino(iodo)silane precursor being:

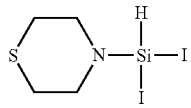

the amino(iodo)silane precursor being:

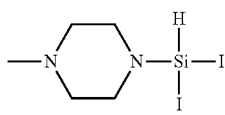

x=1, y=1, and z=2;

the amino(iodo)silane precursor having the formula:

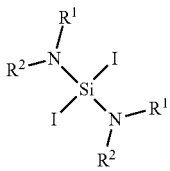

the amino(iodo)silane precursor being:

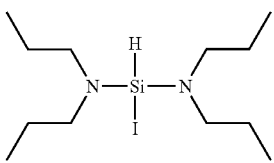

the amino(iodo)silane precursor being:

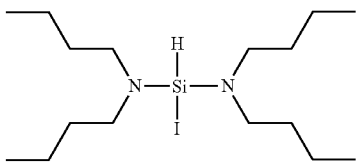

the amino(iodo)silane precursor being:

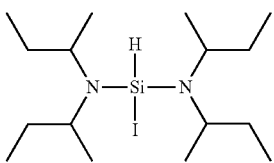

the amino(iodo)silane precursor being:

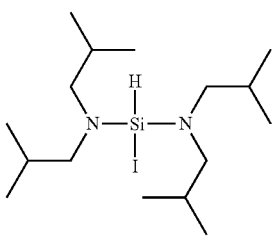

R¹ and R² being joined to form a cyclic nitrogen-containing heterocycle;
the amino(iodo)silane precursor being:

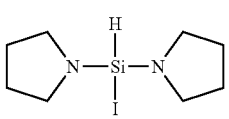 [SMILES: I[SiH](N1CCCC1)N1CCCC1]

the amino(iodo)silane precursor being:

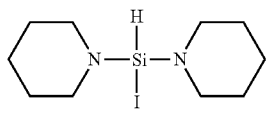 [SMILES: I[SiH](N1CCCCC1)N1CCCCC1]

the amino(iodo)silane precursor being:

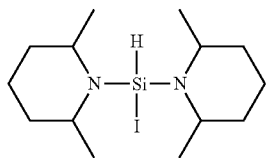 [SMILES: CC1CCCC(C)N1[SiH](I)N1C(C)CCCC1C]

the amino(iodo)silane precursor being:

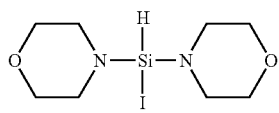

the amino(iodo)silane precursor being:

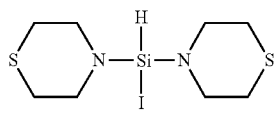

the amino(iodo)silane precursor being:

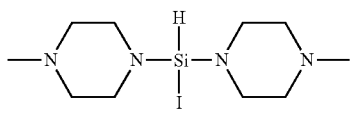

x=0, y=3, and z=1;
the amino(iodo)silane precursor having the formula:

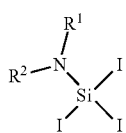

the amino(iodo)silane precursor being:

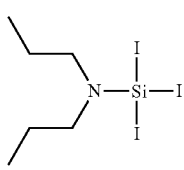

the amino(iodo)silane precursor being:

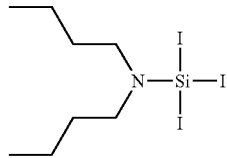

the amino(iodo)silane precursor being:

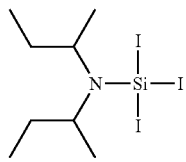

$R^1$ and $R^2$ being joined to form a cyclic nitrogen-containing heterocycle;
the amino(iodo)silane precursor being:

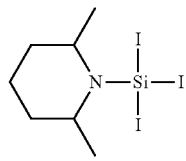

the amino(iodo)silane precursor being:

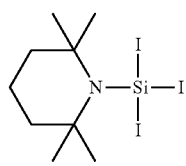

the amino(iodo)silane precursor being:

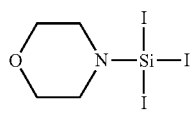

the amino(iodo)silane precursor being:

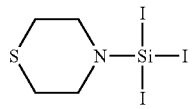

the amino(iodo)silane precursor being:

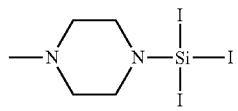

the amino(iodo)silane precursor being:

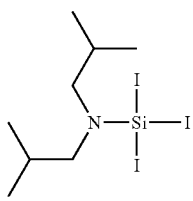

x=0, y=2, and z=2;
the amino(iodo)silane precursor having the formula:

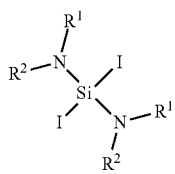

the amino(iodo)silane precursor being:

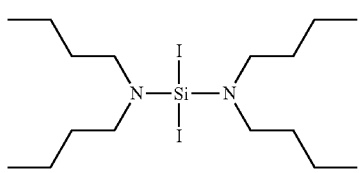 [SMILES: CCCCN(CCCC)[Si](I)(I)N(CCCC)CCCC]

the amino(iodo)silane precursor being:

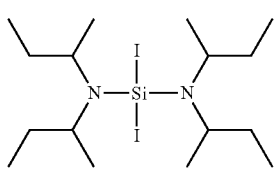 [SMILES: CCC(C)N(C(C)CC)[Si](I)(I)N(C(C)CC)C(C)CC]

the amino(iodo)silane precursor being:

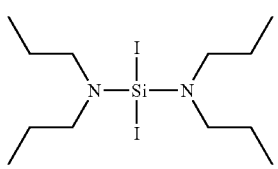 [SMILES: CCCN(CCC)[Si](I)(I)N(CCC)CCC]

the amino(iodo)silane precursor being:

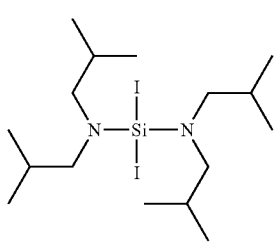 [SMILES: CC(C)CN(CC(C)C)[Si](I)(I)N(CC(C)C)CC(C)C]

$R^1$ and $R^2$ being joined to form a cyclic nitrogen-containing heterocycle;

the amino(iodo)silane precursor being:

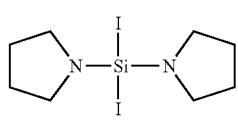 [SMILES: I[Si](I)(N1CCCC1)N1CCCC1]

the amino(iodo)silane precursor being:

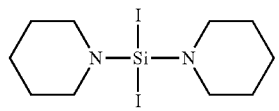 [SMILES: I[Si](I)(N1CCCCC1)N1CCCCC1]

the amino(iodo)silane precursor being:

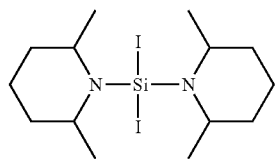 [SMILES: CC1CCCC(C)N1[Si](I)(I)N1C(C)CCCC1C]

the amino(iodo)silane precursor being:

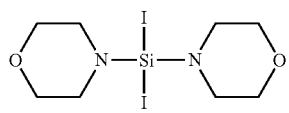 [SMILES: I[Si](I)(N1CCOCC1)N1CCOCC1]

the amino(iodo)silane precursor being:

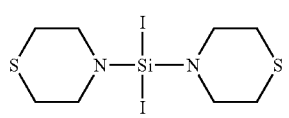 [SMILES: I[Si](I)(N1CCSCC1)N1CCSCC1]

the amino(iodo)silane precursor being:

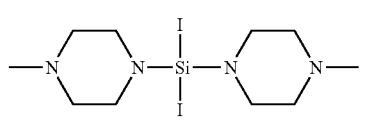

x=0, y=1, and z=3;
the amino(iodo)silane precursor having the formula:

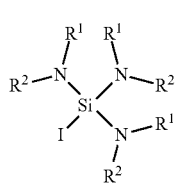

the amino(iodo)silane precursor being:

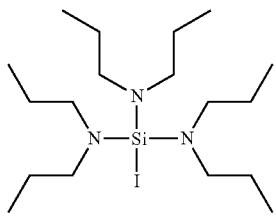 [SMILES: CCCN(CCC)[Si](I)(N(CCC)CCC)N(CCC)CCC]

the amino(iodo)silane precursor being:

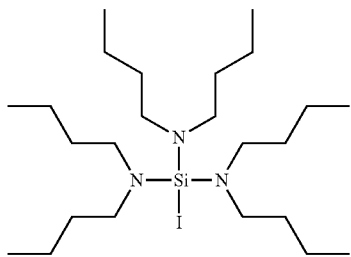 [SMILES: CCCCN(CCCC)[Si](I)(N(CCCC)CCCC)N(CCCC)CCCC]

R¹ and R² being joined to form a cyclic nitrogen-containing heterocycle;
the amino(iodo)silane precursor being:

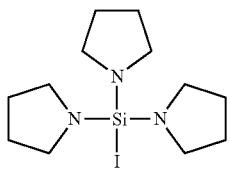 [SMILES: I[Si](N1CCCC1)(N1CCCC1)N1CCCC1]

the amino(iodo)silane precursor being:

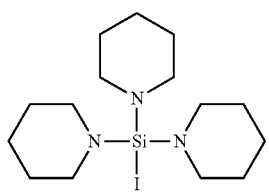 [SMILES: I[Si](N1CCCCC1)(N1CCCCC1)N1CCCCC1]

the amino(iodo)silane precursor being:

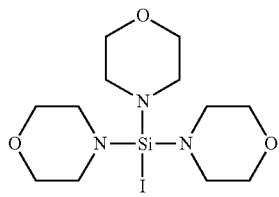

the amino(iodo)silane precursor being:

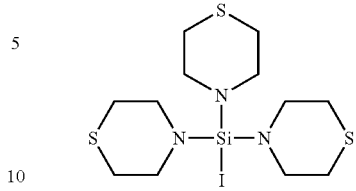

the amino(iodo)silane precursor being:

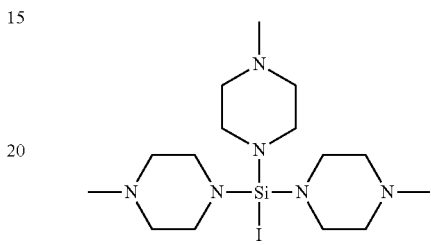

the Si-containing film forming composition comprising between approximately 99% w/w and approximately 100% w/w of the amino(iodo)silane precursor;
the Si-containing film forming composition comprising between approximately 99% w/w and approximately 100% w/w of the amino(iodo)silane precursor after 4 weeks at 50° C.;
the Si-containing film forming composition comprising between approximately 99% w/w and approximately 100% w/w of the amino(iodo)silane precursor after 12 weeks at room temperature (approximately 23° C.);
the Si-containing film forming composition comprising between approximately 95% w/w and approximately 100% w/w of the amino(iodo)silane precursor;
the Si-containing film forming composition comprising between approximately 5% w/w and approximately 50% w/w of the amino(iodo)silane precursor;
the Si-containing film forming composition comprising no water;
the Si-containing film forming composition comprising between approximately 0% w/w and approximately 5% w/w impurities;
the Si-containing film forming composition comprising between approximately 0.0% w/w and approximately 2.0% w/w impurities;
the Si-containing film forming composition comprising between approximately 0.0% w/w and approximately 1.0% w/w impurities;
the impurities including ammonium salts; alkylamines; dialkylamines; alkylimines; iodosilanes; aminosilanes; lithium, sodium, or potassium iodide; iodine; THF; ether; pentane; cyclohexane; heptanes; benzene; toluene; halogenated metal amino(iodo)silane precursors;
the Si-containing film forming composition comprising between approximately 0 ppbw and approximately 1 ppmw metal impurities;
the Si-containing film forming composition comprising between approximately 0 ppbw and approximately 500 ppbw metal impurities;
the Si-containing film forming composition comprising between approximately 0 ppbw and approximately 100 ppbw Al;

the Si-containing film forming composition comprising between approximately 0 ppbw and approximately 100 ppbw As;

the Si-containing film forming composition comprising between approximately 0 ppbw and approximately 100 ppbw Ba;

the Si-containing film forming composition comprising between approximately 0 ppbw and approximately 100 ppbw Be;

the Si-containing film forming composition comprising between approximately 0 ppbw and approximately 100 ppbw Bi;

the Si-containing film forming composition comprising between approximately 0 ppbw and approximately 100 ppbw Cd;

the Si-containing film forming composition comprising between approximately 0 ppbw and approximately 100 ppbw Ca;

the Si-containing film forming composition comprising between approximately 0 ppbw and approximately 100 ppbw Cr;

the Si-containing film forming composition comprising between approximately 0 ppbw and approximately 100 ppbw Co;

the Si-containing film forming composition comprising between approximately 0 ppbw and approximately 100 ppbw Cu;

the Si-containing film forming composition comprising between approximately 0 ppbw and approximately 100 ppbw Ga;

the Si-containing film forming composition comprising between approximately 0 ppbw and approximately 100 ppbw Ge;

the Si-containing film forming composition comprising between approximately 0 ppbw and approximately 100 ppbw Hf;

the Si-containing film forming composition comprising between approximately 0 ppbw and approximately 100 ppbw Zr;

the Si-containing film forming composition comprising between approximately 0 ppbw and approximately 100 ppbw In;

the Si-containing film forming composition comprising between approximately 0 ppbw and approximately 100 ppbw Fe;

the Si-containing film forming composition comprising between approximately 0 ppbw and approximately 100 ppbw Pb;

the Si-containing film forming composition comprising between approximately 0 ppbw and approximately 100 ppbw Li;

the Si-containing film forming composition comprising between approximately 0 ppbw and approximately 100 ppbw Mg;

the Si-containing film forming composition comprising between approximately 0 ppbw and approximately 100 ppbw Mn;

the Si-containing film forming composition comprising between approximately 0 ppbw and approximately 100 ppbw W;

the Si-containing film forming composition comprising between approximately 0 ppbw and approximately 100 ppbw Ni;

the Si-containing film forming composition comprising between approximately 0 ppbw and approximately 100 ppbw K;

the Si-containing film forming composition comprising between approximately 0 ppbw and approximately 100 ppbw Na;

the Si-containing film forming composition comprising between approximately 0 ppbw and approximately 100 ppbw Sr;

the Si-containing film forming composition comprising between approximately 0 ppbw and approximately 100 ppbw Th;

the Si-containing film forming composition comprising between approximately 0 ppbw and approximately 100 ppbw Sn;

the Si-containing film forming composition comprising between approximately 0 ppbw and approximately 100 ppbw Ti;

the Si-containing film forming composition comprising between approximately 0 ppbw and approximately 100 ppbw U;

the Si-containing film forming composition comprising between approximately 0 ppbw and approximately 100 ppbw V;

the Si-containing film forming composition comprising between approximately 0 ppbw and approximately 100 ppbw Zn;

the Si-containing film forming composition comprising between approximately 0 ppmw and approximately 100 ppmw Cl;

the Si-containing film forming composition comprising between approximately 0 ppmw and approximately 100 ppmw Br.

Also disclosed are methods of depositing a Si-containing layer on a substrate. The vapor of any of the Si-containing film forming compositions disclosed above is introduced into a reactor having a substrate disposed therein. At least part of the amino(iodo)silane precursor is deposited onto the substrate to form a Si-containing layer using a vapor deposition method. The disclosed methods may have one or more of the following aspects:

The disclosed Si-containing film forming compositions comprising an amino(iodo)silane precursor selected from $SiH_2I(N(iPr)_2)$, $SiH_2I(N(iBu)_2)$, or combinations thereof;

The disclosed amino(iodo)silane precursor being $SiH_2I(N(iPr)_2)$;

The disclosed amino(iodo)silane precursor being $SiH_2I(N(iBu)_2)$;

introducing into the reactor a vapor comprising a second precursor;

an element of the second precursor being selected from the group consisting of group 2, group 13, group 14, transition metal, lanthanides, and combinations thereof;

the element of the second precursor being selected from Mg, Ca, Sr, Ba, Zr, Hf, Ti, Nb, Ta, Al, Si, Ge, Y, or lanthanides;

introducing a reactant into the reactor;

the reactant being selected from the group consisting of $O_2$, $O_3$, $H_2O$, $H_2O_2$, NO, $NO_2$, a carboxylic acid, radicals thereof, and combinations thereof;

the reactant being plasma treated oxygen;

the reactant being ozone;

the reactant being selected from the group consisting of $H_2$, $NH_3$, $(SiH_3)_3N$, hydridosilanes (such as $SiH_4$, $Si_2H_6$, $Si_3H_8$, $Si_4H_{10}$, $Si_5H_{10}$, $Si_6H_{12}$), chlorosilanes and chloropolysilanes (such as $SiHCl_3$, $SiH_2Cl_2$, $SiH_3Cl$, $Si_2Cl_6$, $Si_2HCl_5$, $Si_3Cl_8$), alkysilanes (such as $Me_2SiH_2$, $Et_2SiH_2$, $MeSiH_3$, $EtSiH_3$), hydrazines (such as $N_2H_4$, $MeHNNH_2$, MeHNNHMe), organic amines (such as NMeH$_2$, NEtH$_2$, NMe$_2$H, NEt$_2$H, NMe$_3$, NEt$_3$, (SiMe$_3$)$_2$NH), pyrazoline, pyridine, B-containing molecules (such as B$_2$H$_6$, 9-borabicylo[3,3,1]none, trimethylboron, triethylboron, borazine), alkyl metals (such as trimethylaluminum, triethylaluminum, dimethylzinc, diethylzinc), radical species thereof, and mixtures thereof;

the reactant being selected from the group consisting of H$_2$, NH$_3$, SiH$_4$, Si$_2$H$_6$, Si$_3$H$_8$, SiH$_2$Me$_2$, SiH$_2$Et$_2$, N(SiH$_3$)$_3$, hydrogen radicals thereof, and mixtures thereof;

the reactant being selected from the group consisting of NH$_3$, N$_2$H$_4$, N(SiH$_3$)$_3$, N(CH$_3$)H$_2$, N(C$_2$H$_5$)H$_2$, N(CH$_3$)$_2$H, N(C$_2$H$_5$)$_2$H, N(CH$_3$)$_3$, N(C$_2$H$_5$)$_3$, (SiMe$_3$)$_2$NH, (CH$_3$)HNNH$_2$, (CH$_3$)$_2$NNH$_2$, nitrogen-containing radical species thereof, and mixtures thereof;

the reactant being HCDS or PCDS;

the reactant being plasma treated N$_2$;

the vapor deposition method being a CVD process;

the vapor deposition method being an ALD process;

the vapor deposition method being a PEALD process; the vapor deposition method being a spatial ALD process;

the Si-containing layer being a silicon oxide layer;

the Si-containing layer being Si;

the Si-containing layer being SiO$_2$;

the Si-containing layer being SiN;

removing the SiN layer;

the Si-containing layer being SiON;

the Si-containing layer being SiCN; and the Si-containing layer being SiCOH.

Also disclosed is a Si-containing film forming composition delivery device comprising a canister having an inlet conduit and an outlet conduit and containing any of the Si-containing film forming compositions disclosed above. The disclosed device may include one or more of the following aspects:

the Si-containing film forming composition having a total concentration of metal contaminants of less than 10 ppmw;

an end of the inlet conduit end located above a surface of the Si-containing film forming composition and an end of the outlet conduit located below the surface of the Si-containing film forming composition;

an end of the inlet conduit end located below a surface of the Si-containing film forming composition and an end of the outlet conduit located above the surface of the Si-containing film forming composition;

further comprising a diaphragm valve on the inlet and the outlet;

further comprising one or more barrier layers on an interior surface of the canister;

further comprising one to four barrier layers on an interior surface of the canister;

further comprising one or two barrier layers on an interior surface of the canister;

each barrier layer comprising a silicon oxide layer, a silicon nitride layer, silicon oxynitride layer, a silicon carbonitride, silicon oxycarbonitride layer, or combinations thereof;

wherein each barrier layer is 5 to 1000 nm in thickness;

wherein each barrier layer is 50 to 500 nm in thickness;

the Si-containing film forming composition comprising SiH$_2$I(N(iPr)$_2$); and the Si-containing film forming composition comprising SiH$_2$I(N(iBu)$_2$).

NOTATION AND NOMENCLATURE

The following detailed description and claims utilize a number of abbreviations, symbols, and terms, which are generally well known in the art. While definitions are typically provided with the first instance of each acronym, for convenience, Table 1 provides a list of the abbreviations, symbols, and terms used along with their respective definitions.

TABLE 1

| | |
|---|---|
| a or an | One or more than one |
| Approximately or about | ±10% of the value stated |
| LCD-TFT | liquid-crystal display |
| TFT | thin-film transistor |
| MIM | Metal-insulator-metal |
| DRAM | dynamic random-access memory |
| FeRam | Ferroelectric random-access memory |
| CVD | chemical vapor deposition |
| LPCVD | low pressure chemical vapor deposition |
| PCVD | pulsed chemical vapor deposition |
| SACVD | sub-atmospheric chemical vapor deposition |
| PECVD | plasma enhanced chemical vapor deposition |
| APCVD | atmospheric pressure chemical vapor deposition |
| HWCVD | hot-wire chemical vapor deposition |
| Flowable PECVD | flowable plasma enhanced chemical vapor deposition |
| MOCVD | metal organic chemical vapor deposition |
| ALD | atomic layer deposition |
| spatial ALD | spatial atomic layer deposition |
| HWALD | hot-wire atomic layer deposition |
| PEALD | plasma enhanced atomic layer deposition |
| DSSD | dual silicone source deposition |
| sccm | standard cubic centimeters per minute |
| MP | melting point |
| TGA | thermogravimetric analysis |
| SDTA | simultaneous differential thermal analysis |
| GCMS | gas chromatography-mass spectrometry |
| SRO | strontium ruthenium oxide |
| HCDS | Hexachlorodisilane |
| PCDS | Pentachlorodisilane |
| LAH | lithium aluminum hydride |
| TriDMAS or TDMAS | Tris(dimethylamino)silane or SiH(NMe$_2$)$_3$ |
| BDMAS | Bis(dimethylamino)silane or SiH$_2$(NMe$_2$)$_2$ |
| BDEAS | Bis(diethylamino)silane or SiH$_2$(NEt$_2$)$_2$ |
| TDEAS | Tris(diethylamino)silane or SiH(NEt$_2$)$_3$ |
| TEMAS | Tris(ethylmethylamino)silane or SiH(NEtMe)$_3$ |
| TMA | trimethyl aluminum or AlMe$_3$ |
| TBTDET | (tert-butylimido)tris(diethylamido) tantalum or Ta(=NtBu)(NEt$_2$)$_3$ |
| TAT-DMAE | tantalum tetraethoxide dimethylaminoethoxide or Ta(OEt)$_4$(OCH$_2$NMe$_2$) |
| PET | polyethylene terephthalate |
| TBTDEN | (tert-butylimido)bis(dimethylamino)niobium or Nb(=NtBu)(NMe$_2$)$_2$ |
| PEN | polyethylene naphthalate |
| Ln(tmhd)$_3$ | lanthanide (2,2,6,6-tetramethyl-3,5-heptanedione)$_3$ |
| alkyl group | saturated functional groups containing exclusively carbon and hydrogen atoms, including linear, branched, or cyclic alkyl groups |
| aryl | aromatic ring compounds where one hydrogen atom has been removed from the ring |
| Hetero | a functional group containing C and a second non-H element, such as S or O |
| heterocycle | cyclic compounds that has atoms of at least two different elements as members of its ring |
| Me | Methyl |
| Et | Ethyl |
| Pr | Propyl, including iPr and nPr |
| iPr | iso-Propyl |
| nPr | n-Propyl |
| Bu | Butyl, including iBu, sBu, and tBu |
| iBu | iso-Butyl |
| sBu | Sec-Butyl |
| tBu | Tert-Butyl |

The standard abbreviations of the elements from the periodic table of elements are used herein. It should be understood that elements may be referred to by these abbreviations (e.g., Si refers to silicon, N refers to nitrogen, O refers to oxygen, C refers to carbon, etc.).

Any and all ranges recited herein are inclusive of their endpoints (i.e., x=1 to 4 includes x=1, x=4, and x=any number in between).

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1{}_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

Please note that the films or layers deposited, such as silicon oxide or silicon nitride, may be listed throughout the specification and claims without reference to their proper stoichiometry (i.e., $SiO_2$, $SiO_3$, $Si_3N_4$). The layers may include pure (Si) layers, carbide ($Si_oC_p$) layers, nitride ($Si_kN_l$) layers, oxide ($Si_nO_m$) layers, or mixtures thereof, wherein k, l, m, n, o, and p inclusively range from 1 to 6. For instance, silicon oxide is $Si_nO_m$, wherein n ranges from 0.5 to 1.5 and m ranges from 1.5 to 3.5. More preferably, the silicon oxide layer is $SiO_2$ or $SiO_3$. The silicon oxide layer may be a silicon oxide based dielectric material, such as organic based or silicon oxide based low-k dielectric materials such as the Black Diamond II or III material by Applied Materials, Inc. Alternatively, any referenced silicon-containing layer may be pure silicon. Any silicon-containing layers may also include dopants, such as B, C, P, As and/or Ge.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
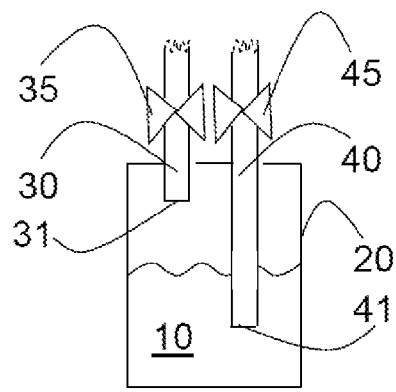
FIG. 1 is a side view of one embodiment of the Si-containing film forming composition delivery device 1.

Disclosed are Si-containing film forming compositions comprising amino(iodo)silane precursors having the following formula:

$$SiH_xI_y(NR^1R^2)_z \tag{I}$$

wherein x+y+z=4; x=0, 1 or 2; y=1, 2 or 3; z=1, 2, or 3; $R^1$ and $R^2$ selected independently from $C_3$-$C_6$ alkyl, aryl, or hetero group; and $R^1$ and $R^2$ may be joined to form a cyclic nitrogen-containing heterocycle.

The disclosed amino(iodo)silane precursors contains one, two, or three iodine atoms directly bonded to the Si atom. These Si—I bonds may help to provide a larger growth rate per cycle when compared to the analogous Si—Cl containing precursors because the Si—I bond energy is lower than the Si—Cl bond energy. Additionally, I has a larger atomic radius than Cl, which may help to prevent I contamination in the resulting film. Notwithstanding any potential I contamination, the improved deposition rate provides the ability to rapidly deposit sacrificial layers and increase process throughput.

The disclosed amino(iodo)silane precursors may contain one or two hydrogen atoms directly bonded to the Si atom. These Si—H bonds may help increase the volatility of the precursor, which is important for vapor deposition processes.

The disclosed amino(iodo)silane precursors contain one, two, or three amino groups directly bonded to the Si atom. These Si—N bonds may help increase thermal stability of the precursor, which is also important for vapor deposition processes. The amino group may also help incorporate N and C atoms into the resulting film, which may make the resulting layer more resistant to any subsequent etching processes.

One of ordinary skill in the art will recognize that the volatility provided by the Si—H bonds competes directly with the thermal stability provided by the amino groups. Applicants believe that $SiH_2I(N(iPr)_2)$ and/or $SiH_2I(N(iBu)_2)$ successfully balance those competing characteristics.

When $R^1$ and $R^2$ form a cyclic nitrogen-containing heterocycle, Applicants believe that the resulting heterocycle forms a leaving group that may be easily detached from the organo(iodo)silane precursor, resulting in less carbon contamination of the resulting film as compared to the acyclic dialkyl amino groups.

Preferably, the disclosed Si-containing film forming compositions have suitable properties for vapor depositions methods, such as vapor pressure ranging from approximately 0.1 Torr at 23° C. to approximately 1,000 Torr at 23° C., a melting point below 20° C. (preferably being in liquid form at room temperature) and more preferably below −20° C. to prevent freeze/thaw issues, and exhibiting 0% v/v to 1% v/v decomposition per week at the desired process temperature. A bulkier R group on the amine, such as iPr or tBu, may help stabilize the disclosed Si-containing film forming compositions, helping to prevent decomposition.

The disclosed Si-containing film forming compositions may be suitable for the deposition of Si-containing films, such as, Si, $SiO_2$, SiON, SiCOH, SiCN, SiN, MSiOx (here M may be an element such as Hf, Zr, Ti, V, Nb, Ta, or Ge, and x may be 0-4 depending upon the oxidation state of M) films by various ALD or CVD processes, such as, ALD, PEALD, PVD, CVD, PECVD, flowable ALD/CVD, DSSD, selective ALD, and may have the following advantages:

liquid at room temperature or having a melting point lower than 50° C.;

thermally stable to enable proper distribution (gas phase or direct liquid injection) without particles generation;

suitable reactivity with the substrate to permit a wide self-limited ALD window, allowing deposition of a variety of Si-containing films, such as SiGe or SiSn, including ternary or quaternary materials, by using one or a combination of reactants (selected from the group comprising of $H_2$, $NH_3$, $O_2$, $H_2O$, $O_3$, $SiH_4$, $Si_2H_6$, $Si_3H_8$, $SiH(NMe_2)_3$ (TriDMAS or TDMAS), $SiH_2(NMe_2)_2$ (BDMAS), $SiH_2(N(Et)_2)_2$ (BDEAS), $SiH(N(Et)_2)_3$(TDEAS), $SiH(NEtMe)_3$ (TEMAS), $(SiH_3)_3N$, $(SiH_3)_2O$, $(GeH_3)_2$, $Bu_4Ge$, $GeMe_4$, $GeEt_4$, $Ge(allyl)$, $(Ge(NMe_2)_4$, $Ge(N(SiMe_3)_2)_4$, $GeCl_2$-dioxane, $GeBr_2$, $GeCl_4$, $Ge(OMe)_4$, $Ge(OEt)_4$, $Sn(O^tBu)_4$, $SnI_4$, $SnMe_4$, $Sn(AcAc)_2$, $Sn(NMe_2)_4$, $Sn(NEt_2)_4$, $Sn(N(SiMe_3)_2)_2$, an aluminum-containing precursor such as trimethyl aluminum (TMA), (tert-butylimido)tris(diethylamido) tantalum (TBTDET), tantalum tetraethoxide dimethyl-aminoethoxide (TAT-DMAE), polyethylene terephthalate (PET), (tert-butylimido)bis(dimethylamino)niobium (TBTDEN), polyethylene naphthalate (PEN), lanthanide-containing precursors such as $Ln(tmhd)_3$ (lanthanide (2,2,6,6-tetramethyl-3,5-heptanedione)$_3$)).

When x=2, y=1, z=1 in formula (I), exemplary amino (iodo)silane precursors include $SiH_2I(NR^1R^2)$ and each precursor molecule contains one nitrogen donor, one iodide and two hydride functional groups, have the structural formula:

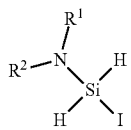

wherein $R^1$ and $R^2$ selected independently from $C_3$-$C_6$ alkyl, aryl, or hetero group and $R^1$ and $R^2$ may be joined to form a cyclic nitrogen-containing heterocycle.

Exemplary amino(iodo)silanes having the formula $SiH_2I(NR^1R^2)$ include:

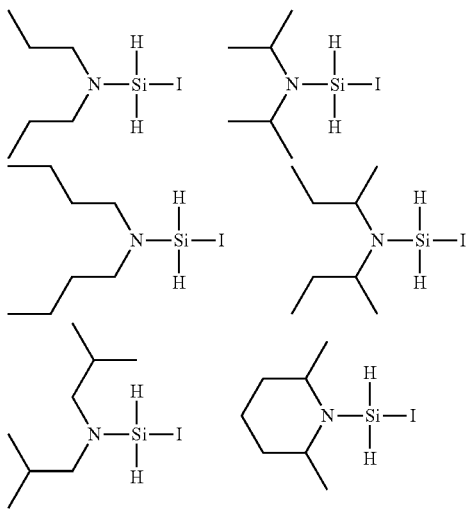

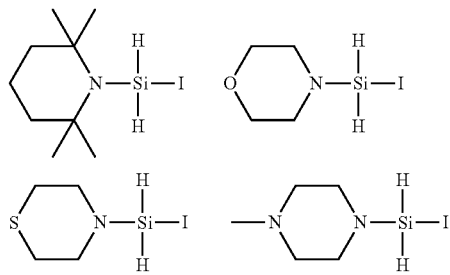

As demonstrated in the examples that follow, $SiH_2I(NiBu_2)$ is more stable than its $SiH_2I(NMe_2)$, $SiH_2I(NEt_2)$ and $SiH_2I(NiPr_2)$ analogs, exhibiting little decomposition after stability testing at 50° C. for 4 weeks.

The above listed $SiH_2I(NR^1R^2)$ precursors may be synthesized by first loading the reaction flask with a hydrocarbon solution of diiodosilane, chilling the solution to −78° C. and addition of a hydrocarbon solution containing two equivalents of the appropriate amine. The resulting suspension may be filtered over a glass fritted filter and the solvent removed to afford the crude product. Alternatively, the above listed $SiH_2I(NR^1R^2)$ precursors may be synthesized by first reacting a chilled hydrocarbon solution of the appropriate amine with one equivalent of a hydrocarbon solution of an alkyl lithium reagent. The resulting lithium amide suspension may then be added to a chilled hydrocarbon solution containing one equivalent of diiodosilane followed by filtration on a glass frit and removal of solvent to afford the product. An additional route to the above listed $SiH_2I(NR^1R^2)$ precursors is to add a neat preparation of $SiH_2(NR^1R^2)_2$ slowly to a chilled flask containing an equimolar amount of diiodosilane. The resulting suspension may be warmed to room temperature while stirring to afford the product.

When x=1, y=2, z=1 in formula (I), exemplary amino (iodo)silane precursors include $SiHI_2(NR^1R^2)$ and each precursor molecule contains one nitrogen donor, two iodide and one hydride functional group, have the structural formula:

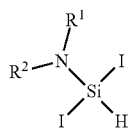

wherein $R^1$ and $R^2$ selected independently from $C_3$-$C_6$ alkyl, aryl, or hetero group and $R^1$ and $R^2$ may be joined to form a cyclic nitrogen-containing heterocycle.

Exemplary amino(iodo)silanes having the formula $SiHI_2(NR^1R^2)$ include:

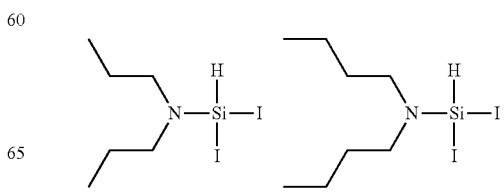

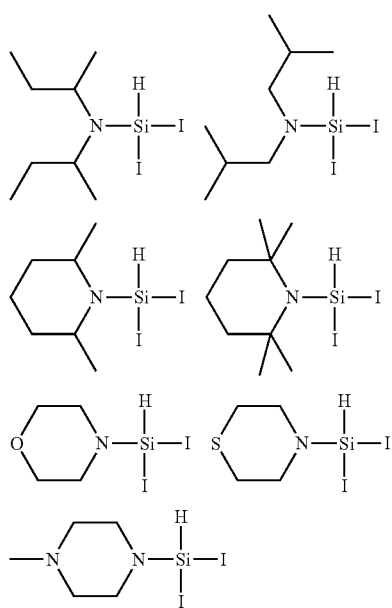

The above listed SiHI$_2$(NR$^1$R$^2$) precursors may be synthesized by first loading the reaction flask with a hydrocarbon solution of triiodosilane, chilling the solution to −78° C. and addition of a hydrocarbon solution containing two equivalents of the appropriate amine. The resulting suspension may be filtered over a glass fritted filter and the solvent removed to afford the crude product. Alternatively, the above listed SiHI$_2$(NR$^1$R$^2$) precursors may be synthesized by first reacting a chilled hydrocarbon solution of the appropriate amine with one equivalent of a hydrocarbon solution of an alkyl lithium reagent. The resulting lithium amide suspension may then be added to a chilled hydrocarbon solution containing one equivalent of triiodosilane followed by filtration on a glass frit and removal of solvent to afford the product. An additional route to the above listed SiHI$_2$(NR$^1$R$^2$) precursors is to add a neat preparation of SiH(NR$^1$R$^2$)$_3$ slowly to a chilled flask containing two equivalents of triiodosilane. The resulting suspension may be warmed to room temperature while stirring to afford the product.

When x=1, y=1, z=2 in formula (I), exemplary amino(iodo)silane precursors include SiHI(NR$^1$R$^2$)$_2$ and each precursor molecule contains two nitrogen donors, one iodide and one hydride functional group, have the structural formula:

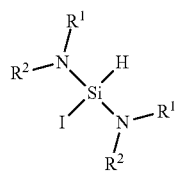

wherein R$^1$ and R$^2$ selected independently from C$_3$-C$_6$ alkyl, aryl, or hetero group and R$^1$ and R$^2$ may be joined to form a cyclic nitrogen-containing heterocycle.

Exemplary amino(iodo)silanes having the formula SiHI(NR$^1$R$^2$)$_2$ include:

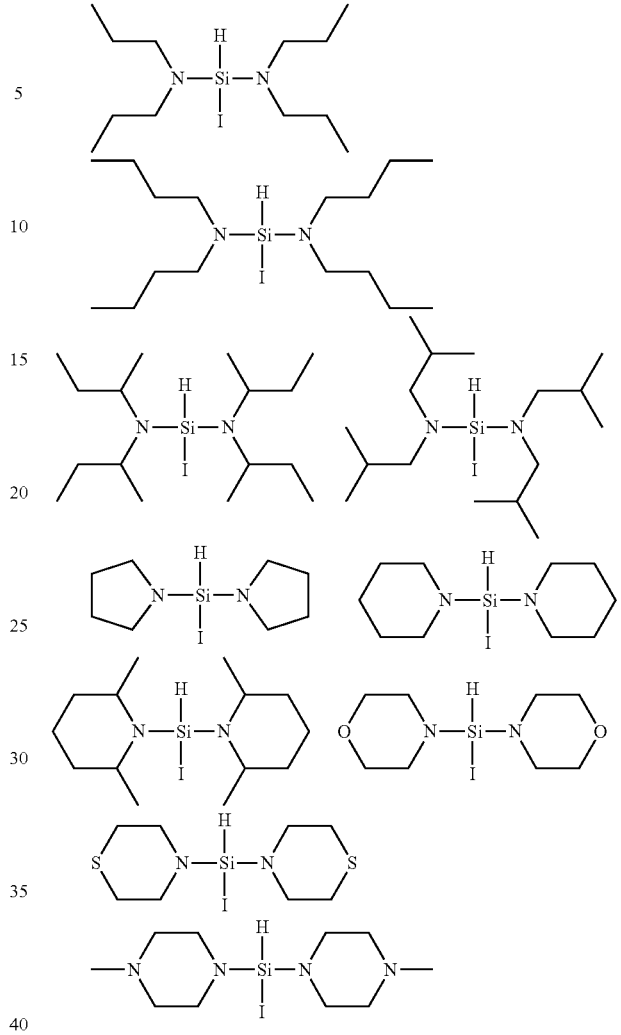

The above listed SiHI(NR$^1$R$^2$)$_2$ precursors may be synthesized by first loading the reaction flask with a hydrocarbon solution of triiodosilane, chilling the solution to −78° C. and addition of a hydrocarbon solution containing four equivalents of the appropriate amine. The resulting suspension may be filtered over a glass fritted filter and the solvent removed to afford the crude product. Alternatively, the above listed SiHI(NR$^1$R$^2$)$_2$ precursors may be synthesized by first reacting a chilled hydrocarbon solution of two equivalents of the appropriate amine with two equivalents of a hydrocarbon solution of an alkyl lithium reagent. The resulting lithium amide suspension may then be added to a chilled hydrocarbon solution containing one equivalent of triiodosilane followed by filtration on a glass frit and removal of solvent to afford the product. An additional route to the above listed SiHI(NR$^1$R$^2$)$_2$ precursors is to add a neat preparation of SiH(NR$^1$R$^2$)$_3$ slowly to a chilled flask containing 0.5 equivalents of triiodosilane. The resulting suspension may be warmed to room temperature while stirring to afford the product.

When x=0, y=3, z=1 in formula (I), exemplary amino(iodo)silane precursors include SiI$_3$(NR$^1$R$^2$) and each precursor molecule contains one nitrogen donor, three iodide and no hydride functional group, have the structural formula:

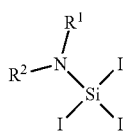

wherein R¹ and R² selected independently from $C_3$-$C_6$ alkyl, aryl, or hetero group and R¹ and R² may be joined to form a cyclic nitrogen-containing heterocycle.

Exemplary amino(iodo)silanes having the formula $SiI_3(NR^1R^2)$ include:

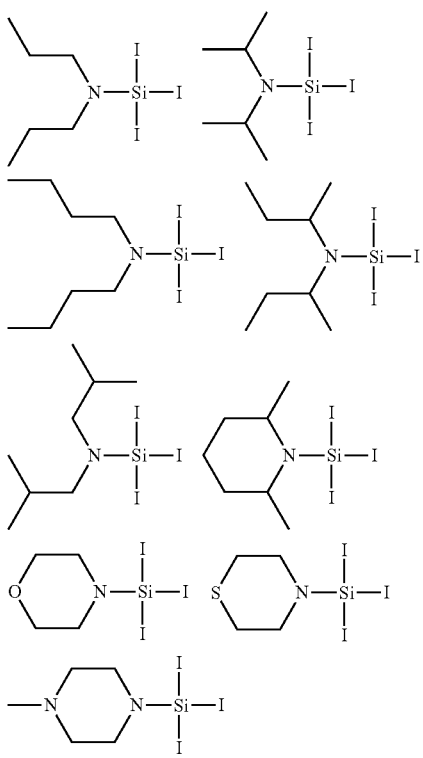

The above listed $SiI_3(NR^1R^2)$ precursors may be synthesized by first loading the reaction flask with a hydrocarbon suspension of silicon tetraiodide, chilling the solution to −78° C. and addition of a hydrocarbon solution containing two equivalents of the appropriate amine. The resulting suspension may be filtered over a glass fritted filter and the solvent removed to afford the crude product. Alternatively, the above listed $SiI_3(NR^1R^2)$ precursors may be synthesized by first reacting a chilled hydrocarbon solution the appropriate amine with one equivalent of a hydrocarbon solution of an alkyl lithium reagent. The resulting lithium amide suspension may then be added to a chilled hydrocarbon suspension containing one equivalent of silicon tetraiodide followed by filtration on a glass frit and removal of solvent to afford the product.

When x=0, y=2, z=2 in formula (I), exemplary amino(iodo)silane precursors include $SiI_2(NR^1R^2)_2$ and each precursor molecule contains two nitrogen donors, two iodide and no hydride functional group, have the structural formula:

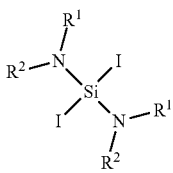

wherein R¹ and R² selected independently from $C_3$-$C_6$ alkyl, aryl, or hetero group and R¹ and R² may be joined to form a cyclic nitrogen-containing heterocycle.

Exemplary amino(iodo)silanes having the formula $SiI_2(NR^1R^2)_2$ include:

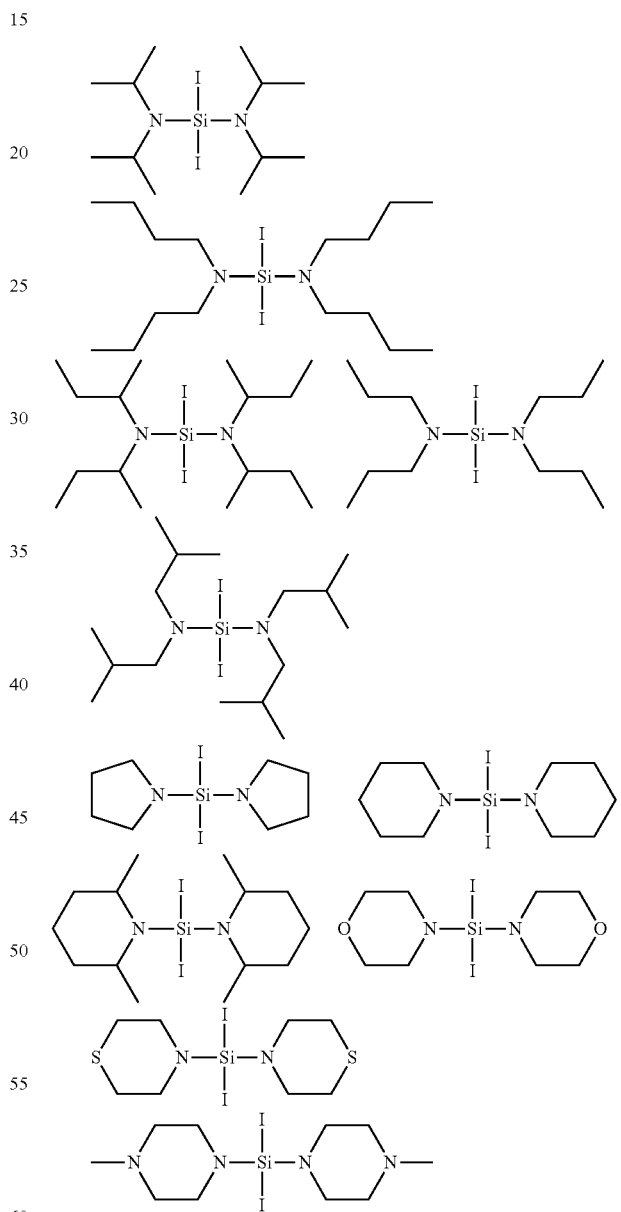

The above listed $SiI_2(NR^1R^2)_2$ precursors may be synthesized by first loading the reaction flask with a hydrocarbon suspension of silicon tetraiodide, chilling the solution to −78° C. and addition of a hydrocarbon solution containing four equivalents of the appropriate amine. The resulting suspension may be filtered over a glass fritted filter and the solvent removed to afford the crude product. Alternatively, the above listed $SiI_2(NR^1R^2)_2$ precursors may be synthesized by first reacting a chilled hydrocarbon solution containing two equivalents of the appropriate amine with two equivalents of a hydrocarbon solution of an alkyl lithium reagent. The resulting lithium amide suspension may then be added to a chilled hydrocarbon suspension containing one equivalent of silicon tetraiodide followed by filtration on a glass frit and removal of solvent to afford the product.

When x=0, y=1, z=3 in formula (I), exemplary amino(iodo)silane precursors include $SiI(NR^1R^2)_3$ and each precursor molecule contains three nitrogen donors, one iodide and no hydride functional group, have the structural formula:

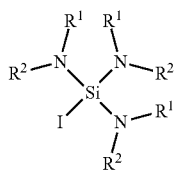

wherein $R^1$ and $R^2$ selected independently from $C_3$-$C_6$ alkyl, aryl, or hetero group and $R^1$ and $R^2$ may be joined to form a cyclic nitrogen-containing heterocycle.

Exemplary amino(iodo)silanes having the formula $SiI(NR^1R^2)_3$ include:

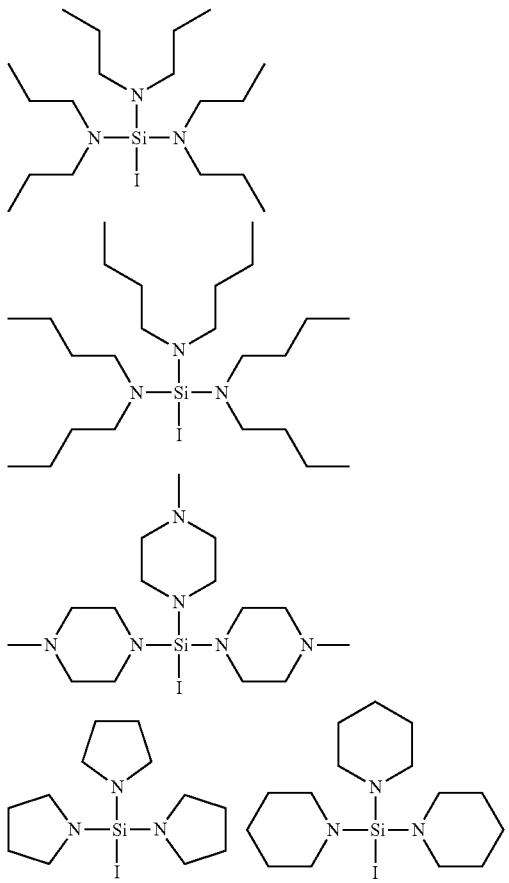

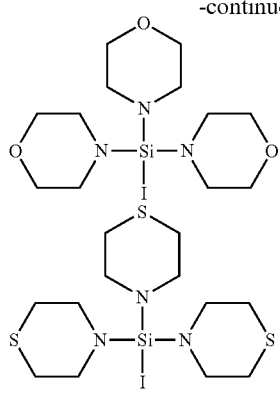

The above listed $SiI(NR^1R^2)_3$ precursors may be synthesized by first loading the reaction flask with a hydrocarbon suspension of silicon tetraiodide, chilling the solution to −78° C. and addition of a hydrocarbon solution containing six equivalents of the appropriate amine. The resulting suspension may be filtered over a glass fritted filter and the solvent removed to afford the crude product. Alternatively, the above listed $SiI(NR^1R^2)_3$ precursors may be synthesized by first reacting a chilled hydrocarbon solution containing three equivalents of the appropriate amine with three equivalents of a hydrocarbon solution of an alkyl lithium reagent. The resulting lithium amide suspension may then be added to a chilled hydrocarbon suspension containing one equivalent of silicon tetraiodide followed by filtration on a glass frit and removal of solvent to afford the product.

Herein, exemplary hydrocarbon solutions suitable for these synthesis methods include diethyl ether, pentane, hexane, or toluene. The resulting suspension is filtered and the resulting solution distilled to remove solvent. Purification of the resulting liquid or solid is carried out by distillation or sublimation, respectively. Except for the ligand compounds $Li[NR^1R^2]$ and diaminosilane compounds all of the starting materials are commercially available. The ligand compound may be synthesized by combining a hydrocarbon solution of metalorganic salt (i.e., alkyl lithium) to a hydrocarbon solution of the appropriate amine. Diaminosilanes may be synthesized as taught by Dussarrat et al. in WO2013109401A1.

To ensure process reliability, the disclosed Si-containing film forming compositions may be purified by continuous or fractional batch distillation or sublimation prior to use to a purity ranging from approximately 95% w/w to approximately 100% w/w, preferably ranging from approximately 98% w/w to approximately 100% w/w. One of ordinary skill in the art will recognize that the purity may be determined by H NMR or gas or liquid chromatography with mass spectrometry. The Si-containing film forming compositions may contain any of the following impurities: ammonium salts; alkylamines, dialkylamines, alkylimines, THF, ether, pentane, cyclohexane, heptanes, toluene, halogenated metal compounds. Preferably, the total quantity of these impurities is below 0.1% w/w. The purified composition may be produced by recrystallization, sublimation, distillation, and/or passing the gas or liquid through a suitable adsorbent, such as a 4 Å molecular sieves.

The concentration of each solvent, such as THF, ether, pentane, cyclohexane, heptanes, and/or toluene, in the purified Si-containing film forming compositions may range from approximately 0% w/w to approximately 5% w/w, preferably from approximately 0% w/w to approximately 0.1% w/w. Solvents may be used in the Si-containing film forming composition's synthesis. Separation of the solvents from the composition may be difficult if both have similar boiling points. Cooling the mixture may produce solid precursor in liquid solvent, which may be separated by filtration. Vacuum distillation may also be used, provided the composition is not heated above approximately its decomposition point.

The disclosed Si-containing film forming composition contains less than 5% v/v, preferably less than 1% v/v, more preferably less than 0.1% v/v, and even more preferably less than 0.01% v/v of any of its analogs or other reaction products. This embodiment may provide better process repeatability. This embodiment may be produced by distillation of the Si-containing film forming composition.

Alternatively, the disclosed Si-containing film forming compositions may comprise between approximately 5% w/w to approximately 50% w/w of one compound with the balance of the composition comprising a second compound, particularly when the mixture provides improved process parameters or isolation of the target compound is too difficult or expensive. For example, the disclosed Si-containing film forming compositions may be 40/60% w/w of $SiHI_2(N(iPr)_2)$ and $SiH_2I(N(iPr)_2)$. The mixture may produce a stable, liquid composition suitable for vapor deposition.

The concentration of trace metals and metalloids in the purified Si-containing film forming composition may each range independently from approximately 0 ppbw to approximately 100 ppbw, and more preferably from approximately 0 ppbw to approximately 10 ppbw. These metal or metalloid impurities include, but are not limited to, Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Indium (In), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Tin (Sn), Titanium (Ti), Uranium (U), Vanadium (V) and Zinc (Zn). The concentration of X (where X=Cl, Br) in the purified Si-containing film forming composition may range between approximately 0 ppmw and approximately 100 ppmw and more preferably between approximately 0 ppmw to approximately 10 ppmw.

Care should be taken to prevent exposure of the disclosed Si-containing film forming compositions to water as this may result in decomposition of the amino(iodo)silane precursors.

Figure 2:
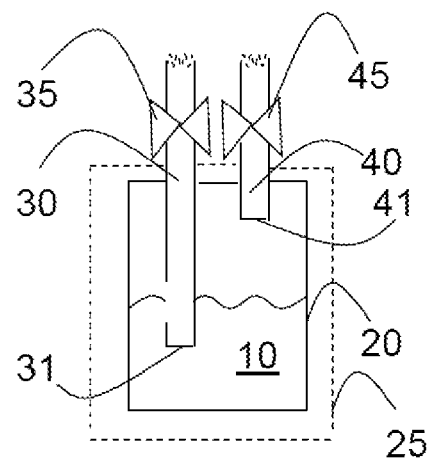
FIG. 2 is a side view of a second embodiment of the Si-containing film forming composition delivery device 1.

The disclosed Si-containing film forming compositions may be delivered to a semiconductor processing tool by the disclosed Si-containing film forming composition delivery devices. FIGS. 1 and 2 show two embodiments of the disclosed delivery devices 1.

FIG. 1 is a side view of one embodiment of the Si-containing film forming composition delivery device 1. In FIG. 1, the disclosed Si-containing film forming composition 10 are contained within a container 20 having two conduits, an inlet conduit 30 and an outlet conduit 40. One of ordinary skill in the precursor art will recognize that the container 20, inlet conduit 30, and outlet conduit 40 are manufactured to prevent the escape of the gaseous form of the Si-containing film forming composition 10, even at elevated temperature and pressure.

Suitable valves include spring-loaded or tied diaphragm valves. The valve may further comprise a restrictive flow orifice (RFO). The delivery device should be connected to a gas manifold and in an enclosure. The gas manifold should permit the safe evacuation and purging of the piping that may be exposed to air when the delivery device is replaced so that any residual amounts of the pyrophoric material does not react. The enclosure should be equipped with sensors and fire control capability to control the fire in the case of a pyrophoric material release. The gas manifold should also be equipped with isolation valves, vacuum generators, and permit the introduction of a purge gas at a minimum.

The delivery device must be leak tight and be equipped with valves that do not permit escape of even minute amounts of the material. The delivery device fluidly connects to other components of the semiconductor processing tool, such as the gas cabinet disclosed above, via valves 35 and 45. Preferably, the delivery device 20, inlet conduit 30, valve 35, outlet conduit 40, and valve 45 are made of 316L EP or 304 stainless steel. However, one of ordinary skill in the art will recognize that other non-reactive materials may also be used in the teachings herein and that any corrosive Si-containing film forming composition 10 may require the use of more corrosion-resistant materials, such as Hastelloy or Inconel.

In FIG. 1, the end 31 of inlet conduit 30 is located above the surface of the Si-containing film forming composition 10, whereas the end 41 of the outlet conduit 40 is located below the surface of the Si-containing film forming composition 10. In this embodiment, the Si-containing film forming composition 10 is preferably in liquid form. An inert gas, including but not limited to nitrogen, argon, helium, and mixtures thereof, may be introduced into the inlet conduit 30. The inert gas pressurizes the delivery device 20 so that the liquid Si-containing film forming composition 10 is forced through the outlet conduit 40 and to components in the semiconductor processing tool (not shown). The semiconductor processing tool may include a vaporizer which transforms the liquid Si-containing film forming composition 10 into a vapor, with or without the use of a carrier gas such as helium, argon, nitrogen or mixtures thereof, in order to deliver the vapor to a chamber where a wafer to be repaired is located and treatment occurs in the vapor phase. Alternatively, the liquid Si-containing film forming composition 10 may be delivered directly to the wafer surface as a jet or aerosol.

FIG. 2 is a side view of a second embodiment of the Si-containing film forming composition delivery device 1. In FIG. 2, the end 31 of inlet conduit 30 is located below the surface of the Si-containing film forming composition 10, whereas the end 41 of the outlet conduit 40 is located above the surface of the Si-containing film forming composition 10. FIG. 2, also includes an optional heating element 25, which may increase the temperature of the Si-containing film forming composition 10. The Si-containing film forming composition 10 may be in solid or liquid form. An inert gas, including but not limited to nitrogen, argon, helium, and mixtures thereof, is introduced into the inlet conduit 30. The inert gas flows through the Si-containing film forming composition 10 and carries a mixture of the inert gas and vaporized Si-containing film forming composition 10 to the outlet conduit 40 and on to the components in the semiconductor processing tool.

Both FIGS. 1 and 2 include valves 35 and 45. One of ordinary skill in the art will recognize that valves 35 and 45 may be placed in an open or closed position to allow flow through conduits 30 and 40, respectively. Either delivery device 1 in FIG. 1 or 2, or a simpler delivery device having a single conduit terminating above the surface of any solid or liquid present, may be used if the Si-containing film forming composition 10 is in vapor form or if sufficient vapor pressure is present above the solid/liquid phase. In this case, the Si-containing film forming composition 10 is delivered in vapor form through the conduit 30 or 40 simply by opening the valve 35 in FIG. 1 or 45 in FIG. 2, respectively. The delivery device 1 may be maintained at a suitable temperature to provide sufficient vapor pressure for the Si-containing film forming composition 10 to be delivered in vapor form, for example by the use of an optional heating element 25.

While FIGS. 1 and 2 disclose two embodiments of the Si-containing film forming composition delivery device 1, one of ordinary skill in the art will recognize that the inlet conduit 30 and outlet conduit 40 may both be located above or below the surface of the Si-containing film forming composition 10 without departing from the disclosure herein. Furthermore, inlet conduit 30 may be a filling port. Finally, one of ordinary skill in the art will recognize that the disclosed Si-containing film forming composition may be delivered to semiconductor processing tools using other delivery devices, such as the ampoules disclosed in WO 2006/059187 to Jurcik et al., without departing from the teachings herein.

Also disclosed are methods of using the disclosed Si-containing film forming compositions for vapor deposition methods. The disclosed methods provide for the use of the Si-containing film forming compositions for deposition of silicon-containing films. The disclosed methods may be useful in the manufacture of semiconductor, photovoltaic, LCD-TFT, flat panel type devices, refractory materials, or aeronautics.

The disclosed methods for forming a silicon-containing layer on a substrate include: placing a substrate in a reactor, delivering into the reactor a vapor of the disclosed Si-containing film forming composition, and contacting the vapor with the substrate (and typically directing the vapor to the substrate) to form a silicon-containing layer on the surface of the substrate.

The methods may include forming a bimetal-containing layer on a substrate using the vapor deposition process and, more specifically, for deposition of $SiMO_x$ films wherein x is 4 and M is Ta, Hf, Nb, Mg, Al, Sr, Y, Ba, Ca, As, Sb, Bi, Sn, Pb, Co, lanthanides (such as Er), or combinations thereof. The disclosed methods may be useful in the manufacture of semiconductor, photovoltaic, LCD-TFT, or flat panel type devices. An oxygen source, such as $O_3$, $O_2$, $H_2O$, NO, $H_2O_2$, acetic acid, formalin, para-formaldehyde, oxygen radicals thereof, and combinations thereof, but preferably $O_3$ or plasma treated $O_2$, may also be introduced into the reactor.

The disclosed Si-containing film forming compositions may be used to deposit silicon-containing films using any deposition methods known to those of skill in the art. Examples of suitable deposition methods include chemical vapor deposition (CVD) or atomic layer deposition (ALD). Exemplary CVD methods include thermal CVD, pulsed CVD (PCVD), low pressure CVD (LPCVD), sub-atmospheric CVD (SACVD) or atmospheric pressure CVD (APCVD), hot-wire CVD (HWCVD, also known as cat-CVD, in which a hot wire serves as an energy source for the deposition process), radicals incorporated CVD, plasma enhanced CVD (PECVD) including but not limited to flowable PECVD, and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably ALD, PE-ALD, or spatial ALD in order to provide suitable step coverage and film thickness control.

The vapor of the Si-containing film forming composition is generated and then introduced into a reaction chamber containing a substrate. The temperature and the pressure in the reaction chamber and the temperature of the substrate are held at conditions suitable for vapor deposition of at least part of the amino(iodo)silane precursor onto the substrate. In other words, after introduction of the vaporized composition into the reaction chamber, conditions within the reaction chamber are adjusted such that at least part of the precursor is deposited onto the substrate to form the Si-containing layer. One of ordinary skill in the art will recognize that "at least part of the precursor is deposited" means that some or all of the precursor reacts with or adheres to the substrate. Herein, a reactant may also be used to help in formation of the Si-containing layer.

The reaction chamber may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems. All of these exemplary reaction chambers are capable of serving as an ALD or CVD reaction chamber. The reaction chamber may be maintained at a pressure ranging from about 0.5 mTorr to about 20 Torr for all ALD and subatmospheric CVD. Subatmospheric CVD and atmospheric CVD pressures may range up to 760 Torr (atmosphere). In addition, the temperature within the reaction chamber may range from about 20° C. to about 600° C. One of ordinary skill in the art will recognize that the temperature may be optimized through mere experimentation to achieve the desired result.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 20° C. to approximately 600° C. When a plasma deposition process is utilized, the deposition temperature may range from approximately 20° C. to approximately 550° C. Alternatively, when a thermal process is performed, the deposition temperature may range from approximately 300° C. to approximately 600° C.

Alternatively, the substrate may be heated to a sufficient temperature to obtain the desired silicon-containing film at a sufficient growth rate and with desired physical state and composition. A non-limiting exemplary temperature range to which the substrate may be heated includes from 150° C. to 600° C. Preferably, the temperature of the substrate remains less than or equal to 500° C.

The reactor contains one or more substrates onto which the films will be deposited. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, silica, glass, or GaAs wafers. The wafer may have one or more layers of differing materials deposited on it from a previous manufacturing step. For example, the wafers may include silicon layers (crystalline, amorphous, porous, etc.), silicon oxide layers, silicon nitride layers, silicon oxy nitride layers, carbon doped silicon oxide (SiCOH) layers, or combinations thereof. Additionally, the wafers may include copper layers or noble metal layers (e.g. platinum, palladium, rhodium, or gold). The layers may include oxides which are used as dielectric materials in MIM, DRAM, or FeRam technologies (e.g., $ZrO_2$ based materials, $HfO_2$ based materials, $TiO_2$ based materials, rare earth oxide based materials, ternary oxide based materials such as strontium ruthenium oxide [SRO], etc.) or from nitride-based films (e.g., TaN) that are used as an oxygen barrier between copper and the low-k layer. The wafers may include barrier layers, such as manganese, manganese oxide, etc. Plastic layers, such as poly(3,4-ethylenedioxythiophene)poly(styrenesulfonate) [PEDOT:PSS] may also be used. The layers may be planar or patterned. For example, the layer may be a patterned photoresist film made of hydrogenated carbon, for example $CH_x$, wherein x is greater than zero.

The disclosed processes may deposit the silicon-containing layer directly on the wafer or directly on one or more than one (when patterned layers form the substrate) of the layers on top of the wafer. The substrate may be patterned to include vias or trenches having high aspect ratios. For example, a conformal Si-containing film, such as $SiO_2$, may be deposited using any ALD technique on a through silicon via (TSV) having an aspect ratio ranging from approximately 20:1 to approximately 100:1. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. In many instances though, the preferred substrate utilized may be selected from hydrogenated carbon, TiN, SRO, Ru, and Si type substrates, such as polysilicon or crystalline silicon substrates. For example, a silicon nitride film may be deposited onto a Si layer. In subsequent processing, alternating silicon oxide and silicon nitride layers may be deposited on the silicon nitride layer forming a stack of multiple $SiO_2$/SiN layers used in 3D NAND gates.

The disclosed Si-containing film forming compositions may be supplied either in neat form or in a blend with a suitable solvent, such as toluene, ethyl benzene, xylene, mesitylene, decane, dodecane, octane, hexane, pentane, tertiary amines, acetone, tetrahydrofuran, ethanol, ethylmethylketone, 1,4-dioxane, or others. The disclosed compositions may be present in varying concentrations in the solvent. For example, the resulting concentration may range from approximately 0.05M to approximately 2M.

The neat or blended Si-containing film forming compositions are delivered into a reactor in vapor form by conventional means, such as tubing and/or flow meters. The composition in vapor form may be produced by vaporizing the neat or blended composition through a conventional vaporization step such as direct vaporization, distillation, by bubbling, or by using a sublimator such as the one disclosed in PCT Publication WO2009/087609 to Xu et al. The neat or blended composition may be fed in liquid state to a vaporizer where it is vaporized before it is introduced into the reactor. Alternatively, the neat or blended composition may be vaporized by passing a carrier gas into a container containing the composition or by bubbling of the carrier gas into the composition. The carrier gas may include, but is not limited to, Ar, He, or $N_2$, and mixtures thereof. Bubbling with a carrier gas may also remove any dissolved oxygen present in the neat or blended composition. The carrier gas and composition are then introduced into the reactor as a vapor.

If necessary, the container may be heated to a temperature that permits the Si-containing film forming composition to be in its liquid phase and to have a sufficient vapor pressure. The container may be maintained at temperatures in the range of, for example, 0-150° C. Those skilled in the art recognize that the temperature of the container may be adjusted in a known manner to control the amount of Si-containing film forming composition vaporized.

In addition to the disclosed precursor, a reactant may also be introduced into the reactor. The reactant may be an oxidizing agent, such as one of $O_2$, $O_3$, $H_2O$, $H_2O_2$; oxygen containing radicals, such as O. or OH., NO, $NO_2$; carboxylic acids such as formic acid, acetic acid, propionic acid, radical species of NO, $NO_2$, or the carboxylic acids; para-formaldehyde; and mixtures thereof. Preferably, the oxidizing agent is selected from the group consisting of $O_2$, $O_3$, $H_2O$, $H_2O_2$, oxygen containing radicals thereof such as O. or OH., and mixtures thereof. Preferably, when an ALD process is performed, the reactant is plasma treated oxygen, ozone, or combinations thereof. When an oxidizing agent is used, the resulting silicon containing film will also contain oxygen.

Alternatively, the reactant may be a reducing agent such as one of $H_2$, $NH_3$, $(SiH_3)_3N$, hydridosilanes (for example, $SiH_4$, $Si_2H_6$, $Si_3H_8$, $Si_4H_{10}$, $Si_5H_{10}$, $Si_6H_{12}$), chlorosilanes and chloropolysilanes (for example, $SiHCl_3$, $SiH_2Cl_2$, $SIH_3Cl$, $Si_2Cl_6$, $Si_2HCl_5$, $Si_3Cl_8$), alkylsilanes (for example, $(CH_3)_2SiH_2$, $(C_2H_5)_2SiH_2$, $(CH_3)SiH_3$, $(C_2H_5)SiH_3$), hydrazines (for example, $N_2H_4$, $MeHNNH_2$, $MeHNNHMe$), organic amines (for example, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$), pyrazoline, pyridine, B-containing molecules (for example, $B_2H_6$, 9-borabicyclo[3,3,1]none, trimethylboron, triethylboron, borazine), alkyl metals (such as trimethylaluminum, triethylaluminum, dimethylzinc, diethylzinc), radical species thereof, and mixtures thereof. Preferably, the reducing agent is $H_2$, $NH_3$, $SiH_4$, $Si_2H_6$, $Si_3H_8$, $SiH_2Me_2$, $SiH_2Et_2$, $N(SiH_3)_3$, hydrogen radicals thereof, or mixtures thereof. Preferably, the reducing agent is $SiHCl_3$, $Si_2Cl_6$, $Si_2HCl_5$, $Si_2H_2Cl_4$, and cyclo-$Si_6H_6Cl_6$. When a reducing agent is used, the resulting silicon containing film may be pure Si.

The reactant may be treated by plasma, in order to decompose the reactant into its radical form. $N_2$ may also be utilized as a reducing agent when treated with plasma. For instance, the plasma may be generated with a power ranging from about 50W to about 500W, preferably from about 100W to about 200W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

The disclosed Si-containing film forming composition may also be used with a halosilane or polyhalodisilane, such as hexachlorodisilane, pentachlorodisilane, or tetrachlorodisilane, and one or more reactants to form Si, SiCN, or SiCOH films. PCT Publication Number WO2011/123792 discloses a SiN layer, and the entire contents of which are incorporated herein in their entireties.

When the desired silicon-containing film also contains another element, such as, for example and without limitation, Ta, Hf, Nb, Mg, Al, Sr, Y, Ba, Ca, As, Sb, Bi, Sn, Pb, Co, lanthanides (such as Er), or combinations thereof, the reactants may include a another precursor which is selected from, but not limited to, alkyls, such as $Ln(RCp)_3$ or $Co(RCp)_2$, amines, such as $Nb(Cp)(NtBu)(NMe_2)_3$ or any combination thereof.

The Si-containing film forming composition and one or more reactants may be introduced into the reaction chamber simultaneously (e.g., CVD), sequentially (e.g., ALD), or in other combinations. For example, the Si-containing film forming composition may be introduced in one pulse and two additional reactants may be introduced together in a separate pulse (e.g., modified ALD). Alternatively, the reaction chamber may already contain the reactant prior to introduction of the Si-containing film forming composition. The reactant may be passed through a plasma system localized or remotely from the reaction chamber, and decomposed to radicals. Alternatively, the Si-containing film forming composition may be introduced to the reaction chamber continuously while other reactants are introduced by pulse (e.g., pulsed-CVD). In each example, a pulse may be followed by a purge or evacuation step to remove excess amounts of the component introduced. In each example, the pulse may last for a time period ranging from about 0.01 s to about 10 s, alternatively from about 0.3 s to about 3 s, alternatively from about 0.5 s to about 2 s. In another alternative, the Si-containing film forming composition and one or more reactants may be simultaneously sprayed from a shower head under which a susceptor holding several wafers is spun (e.g., spatial ALD).

In one non-limiting exemplary ALD type process, the vapor phase of a Si-containing film forming composition is introduced into the reaction chamber, where at least part of the amino(iodo)silane precursor reacts with a suitable substrate, such as Si, $SiO_2$, $Al_2O_3$, etc., to form an adsorbed silane layer. Excess composition may then be removed from the reaction chamber by purging and/or evacuating the reaction chamber. An oxygen source is introduced into the reaction chamber where it reacts with the absorbed silane layer in a self-limiting manner. Any excess oxygen source is removed from the reaction chamber by purging and/or evacuating the reaction chamber. If the desired film is a silicon oxide film, this two-step process may provide the desired film thickness or may be repeated until a film having the necessary thickness has been obtained.

Alternatively, if the desired film contains a second element (i.e., $SiMO_x$, wherein x may be 4 and M is Ta, Hf, Nb, Mg, Al, Sr, Y, Ba, Ca, As, Sb, Bi, Sn, Pb, Co, lanthanides (such as Er), or combinations thereof), the two-step process above may be followed by introduction of a vapor of a second precursor into the reaction chamber. The second precursor will be selected based on the nature of the oxide film being deposited. After introduction into the reaction chamber, the second precursor is contacted with the substrate. Any excess second precursor is removed from the reaction chamber by purging and/or evacuating the reaction chamber. Once again, an oxygen source may be introduced into the reaction chamber to react with the second precursor. Excess oxygen source is removed from the reaction chamber by purging and/or evacuating the reaction chamber. If a desired film thickness has been achieved, the process may be terminated. However, if a thicker film is desired, the entire four-step process may be repeated. By alternating the provision of the amino(iodo)silane precursor, second precursor, and oxygen source, a film of desired composition and thickness can be deposited.

Additionally, by varying the number of pulses, films having a desired stoichiometric M:Si ratio may be obtained. For example, a $SiMO_2$ film may be obtained by having one pulse of the Si-containing film forming composition and one pulses of the second precursor, with each pulse being followed by pulses of the oxygen source. However, one of ordinary skill in the art will recognize that the number of pulses required to obtain the desired film may not be identical to the stoichiometric ratio of the resulting film.

In another alternative, dense SiCN films may be deposited using an ALD method with hexachlorodisilane (HCDS) or pentachlorodisilane (PCDS), the disclosed Si-containing film forming composition, and an ammonia reactant. The reaction chamber may be controlled at 5 Torr, 550° C., with a 55 sccm continuous flow of Ar. An approximately 10 second long pulse of the Si-containing film forming composition at a flow rate of approximately 1 sccm is introduced into the reaction chamber. Any excess Si-containing film forming composition is purged from the reaction chamber with an approximately 55 sccm flow of Ar for approximately 30 seconds. An approximately 10 second pulse of HCDS at a flow rate of approximately 1 sccm is introduced into the reaction chamber. Any excess HCDS is purged from the reaction chamber with an approximately 55 sccm flow of Ar for approximately 30 seconds. An approximately 10 second long pulse of $NH_3$ at a flow rate of approximately 50 sccm is introduced into the reaction chamber. Any excess $NH_3$ is purged from the reaction chamber with an approximately 55 sccm flow of Ar for approximately 10 seconds. These 6 steps are repeated until the deposited layer achieves a suitable thickness. One of ordinary skill in the art will recognize that the introductory pulses may be simultaneous when using a spatial ALD device. As described in PCT Pub No WO2011/123792, the order of the introduction of the precursors may be varied and the deposition may be performed with or without the $NH_3$ reactant in order to tune the amounts of carbon and nitrogen in the SiCN film.

In yet another alternative, a silicon-containing film may be deposited by the flowable PECVD method disclosed in U.S. Patent Application Publication No. US2014/0051264 A1 using the disclosed compositions and a radical nitrogen- or oxygen-containing reactant. The radical nitrogen- or oxygen-containing reactant, such as $NH_3$ or $H_2O$ respectively, is generated in a remote plasma system. The radical reactant and the vapor phase of the disclosed compositions are introduced into the reaction chamber where they react and deposit the initially flowable film on the substrate. Applicants believe that the nitrogen atoms of the amino groups in the disclosed precursors help to further improve the flowability of the deposited film, resulting in films having less voids or pores (i.e., dense films).

The silicon-containing films resulting from the processes discussed above may include Si, $SiO_2$, SiN, SiC, SiON, SiCN, SiCON, SiCOH, or $MSiO_x$, wherein M is an element such as Hf, Zr, Ti, Nb, Ta, or Ge, and x may be from 0-4, depending on the oxidation state of M. One of ordinary skill in the art will recognize that by judicial selection of the appropriate Si-containing film forming composition and reactants, the desired film composition may be obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the silicon-containing film may be exposed to a temperature ranging from approximately 200° C. and approximately 1000° C. for a time ranging from approximately 0.1 second to approximately 7200 seconds under an inert atmosphere, a H-containing atmosphere, a N-containing atmosphere, an O-containing atmosphere, or combinations thereof. Most preferably, the temperature is 600° C. for less than 3600 seconds under an H-containing atmosphere. The resulting film may contain fewer impurities and therefore may have improved performance characteristics. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially thermal annealing, has been found effective to reduce carbon and nitrogen contamination of the silicon-containing film.

EXAMPLES

The following non-limiting examples are provided to further illustrate embodiments of the invention. However, the examples are not intended to be all inclusive and are not intended to limit the scope of the inventions described herein.

Comparative Example 1

Synthesis and Properties of SiHI(NMe$_2$)$_2$

A flask containing tris(dimethylamino)silane (15.9 g, 0.099 mol) under an atmosphere of dry N$_2$ is chilled to 0° C. and triiodosilane (20.4 g, 0.049 mol) is added at a rate of ~1 mL/minute. Some fuming is observed initially. The reaction is subsequently allowed to warm to room temperature and stirred for 16 hours to obtain a slightly cloudy, pale yellow liquid. The product is distilled over a short path column (30-35° C., 80-110 mTorr) to yield a colorless, air sensitive, free flowing liquid (23.3 g, 65% yield). The product identified as bis(dimethylamino)iodosilane was analyzed by GCMS which shows >95% purity. Structure and purity were confirmed by $^1$H & $^{13}$C NMR.

Figure 3:
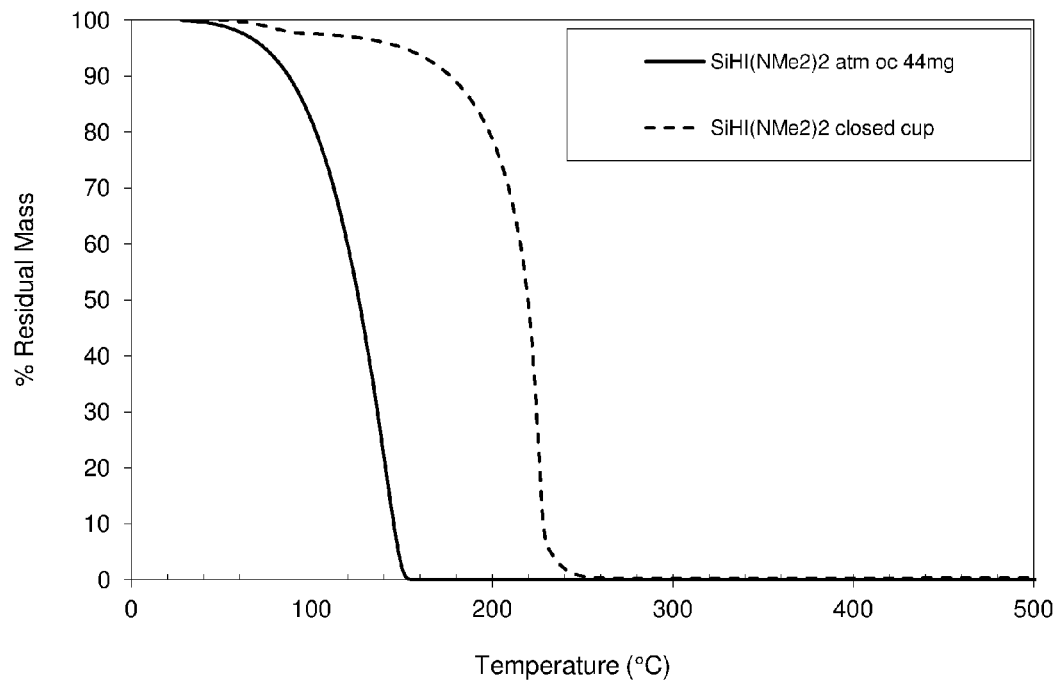
FIG. 3 is a Thermogravimetric Analysis (TGA) graph demonstrating the percentage of weight loss with increasing temperature of $SiHI(NMe_2)_2$.

The TGA analysis of SiHI(NMe$_2$)$_2$ is shown in FIG. 3. Both the open cup and closed cup TGA graphs show clean evaporation with a low (<1%) residue. The closed cup TGA shows a slight step at 100° C. due to presence of a small amount of starting material in the product. One skilled in the art will recognize that isolation of the product may be difficult due to its similar boiling point to the starting reactant, SiH(NMe$_2$)$_3$.

Comparative Example 2

Synthesis of SiH$_2$I(NMe$_2$)

Under an atmosphere of dry N$_2$ at 23° C., tris(dimethylamino)silane (1.61 g, 9.92 mmol) is added dropwise to a flask containing diiodosilane (2.80 g, 9.86 mmol). Some fuming is initially observed. After one hour of stirring, a sample of the product mixture is dissolved in dichloromethane (0.5 mL, 7.83 mmol) and analyzed by GCMS. Three products are observed: dimethylamino(iodo)silane, dimethylamino(diiodo)silane and bis(dimethlyamino)iodosilane. The mixture is stored under dry N$_2$ for one week at 23° C. and analyzed again by GCMS where it is observed that the peak area integration of dimethylamino(iodo)silane has significantly decreased (from ca 12% to ca 2%) with the formation of decomposition products. This example confirms the results obtained by Anderson et al. showing that this product decomposes (J. Chem. Soc. Dalton Trans. 1987, pp. 3029-3034).

Comparative Example 3

Synthesis and Properties of SiH$_2$I(NEt$_2$)

Synthesis route: SiH$_2$(NEt$_2$)$_2$+SiH$_2$I$_2$→2SiH$_2$I(NEt$_2$) (neat reaction).

Under an atmosphere of pure N$_2$ a flask is charged with diiodosilane (SiH$_2$I$_2$) (41.2 g, 0.145 mol) and cooled to 0° C. Bis(diethylamino)silane (SiH$_2$(NEt$_2$)$_2$) (25.4 g, 0.146 mol) is chilled to 0° C. and then added at a rate of ~0.5 mL/minute to the reaction flask. Fuming is observed during the course of the addition. The reaction is subsequently allowed to warm to room temperature and stirred for 4 hours to obtain a cloudy, pale yellow liquid.

The crude product is then distilled over a short path column (30-32° C., 1.2 mTorr) to yield a colorless, air sensitive, free flowing liquid (57.3 g, 86% yield). The product was analyzed by GCMS & $^1$H NMR which shows >99% purity. The structure of the product is confirmed by $^1$H, $^{13}$C & $^{29}$Si NMR. Melting point is less than −70° C. Vapor pressure=10 Torr @ 27° C.

Figure 4:
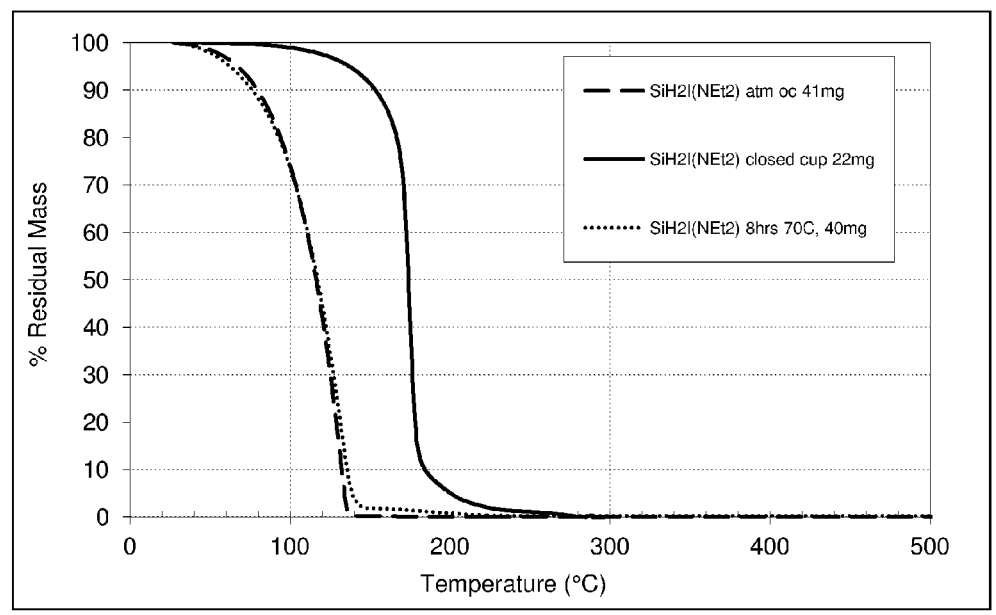
FIG. 4 is a TGA graph demonstrating the percentage of weight loss with increasing temperature of $SiH_2I(NEt_2)$.

FIG. 4 is distilled SiH$_2$I(NEt$_2$) TGA data. As shown, the open cup TGA shows clean evaporation and low (<1%) residue for SiH$_2$I(NEt$_2$) both before and after heating to 70° C. for 8 hours but thermally stressed material shows a small step behavior (due to small % of decomposition). The closed cup measurement shows step behavior over ~180° C. Thermal stability tests of SiH$_2$I(NEt$_2$) show solids formation upon heating over time.

Comparative Example 4

Attempted Synthesis of SiH$_2$I(NHtBu)

Under an atmosphere of dry N$_2$ at 23° C., bis(tert-butylamino)silane (1.72 g, 9.86 mmol) is added dropwise to a flask containing diiodosilane (2.80 g, 9.86 mmol). Some fuming and the formation of colorless solids are observed. A sample of the product mixture is dissolved in dichloromethane (0.5 mL, 7.83 mmol) and analyzed by GCMS. The observed products do not include the target compound (tert-butylamino)iodosilane.

Comparative Example 5

Attempted Synthesis of SiI$_2$(NMe$_2$)

Under an atmosphere of dry N$_2$, anhydrous toluene (30.0 mL, 0.284 mol) was added to a flask containing silicon tetraiodide (25.2 g, 0.047 mol) and equipped with a condenser. Tetrakis(dimethylamino)silane (10.4 g, 0.051 mol) is added followed by triethylamine (1.0 mL, 0.007 mol) and the mixture heated with stirring to form a yellow solution at 90° C. for 6 hours. The reaction is cooled to 23° C. and an aliquot taken for analysis by GCMS. The composition of the silicon containing products is observed as follows: Si(NMe$_2$)$_4$ (60.1%), SiI(NMe$_2$)$_3$, (2.2%), SiI$_2$(NMe$_2$)$_2$ (3.1%), SiI$_3$(NMe$_2$) (3.7%) and SiI$_4$(NMe$_2$) (30.9%).

Example 1

Synthesis and Properties of SiH$_2$I(N(iPr)$_2$)

Synthesis Route: SiH$_2$I$_2$+SiH$_2$(N(iPr)$_2$)$_2$→2SiH$_2$I(N(iPr)$_2$) (neat reaction)

Under an atmosphere of pure N$_2$ a flask is charged with diiodosilane (28.5 g, 0.100 mol). At 24° C., bis(diisopropylamino)silane (23.4 g, 0.101 mol) is added at a rate of ~1 mL/minute and stirred for 4 hours to obtain a cloudy, pale yellow liquid.

The crude product is then distilled over a short path column (25-30° C., 80-120 mTorr) to yield a colorless, air sensitive, free flowing liquid (43.2 g, 84% yield). The product was analyzed by GCMS & $^1$H NMR which shows >99% purity. Structure confirmed by $^1$H, $^{13}$C & $^{29}$Si NMR.

Figure 5:
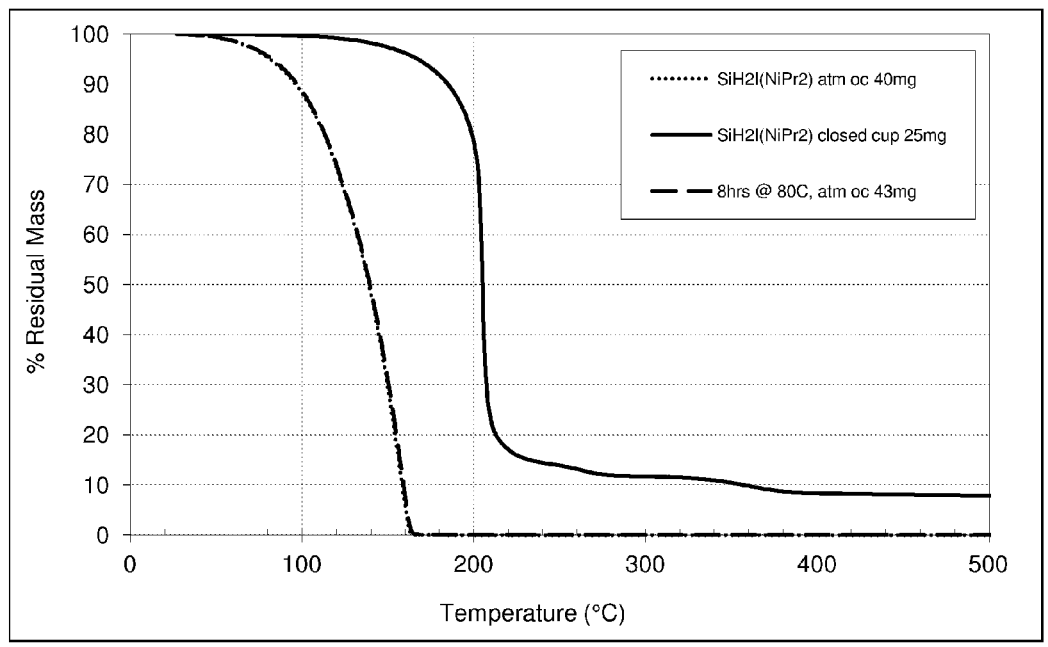
FIG. 5 is a TGA graph demonstrating the percentage of weight loss with increasing temperature of $SiH_2I(N^iPr_2)$.

$^1$H & $^{29}$Si NMR confirms GCMS, shows single product SiH$_2$I(N(iPr)$_2$). $^{13}$C NMR shows expected peaks for clean product SiH$_2$I(N(iPr)$_2$). Melting point is −8° C. Vapor pressure @ 41° C. is 10 Torr. Density @ 24° C. is 1.35 g/mL. Viscosity @ 24° C. is 1.42 cSt FIG. 5 shows distilled SiH$_2$I(N(iPr)$_2$) TGA data. As shown, the open cup TGA shows clean evaporation and low (<1%) residue for SiH$_2$I(N(iPr)$_2$) both before and after heating to 80° C. for 8 hours: shows good stability. The closed cup measurement shows step behavior over 200° C. Thermal Test @ 80° C. for 8 hrs demonstrates <1% decomposition showing solids formation upon heating over time.

Example 2

Synthesis and Properties of SiH$_2$I(N(iBu)$_2$)

Synthesis Route is SiH$_2$I$_2$+SiH$_2$(N(iBu)$_2$)$_2$→2SiH$_2$I(N(iBu)$_2$) (neat reaction)

Under an atmosphere of pure N$_2$ a flask is charged with diiodosilane (15.6 g, 0.055 mol) and cooled to 0° C. Bis(dibutylamino)silane (15.8 g, 0.055 mol) is chilled to 0° C. and then added at a rate of ~1 mL/minute to the reaction flask. Fuming is observed initially. The reaction is subsequently allowed to warm to room temperature and stirred for 6 hours to obtain a cloudy, pale yellow liquid.

The crude product is then distilled over a short path column (33-37° C., 50-70 mTorr) to yield a colorless, air sensitive, free flowing liquid (27.6 g, 88% yield). The product was analyzed by GCMS which shows >99% purity. Structure confirmed by $^1$H, $^{13}$C & $^{29}$Si NMR.

Figure 6:
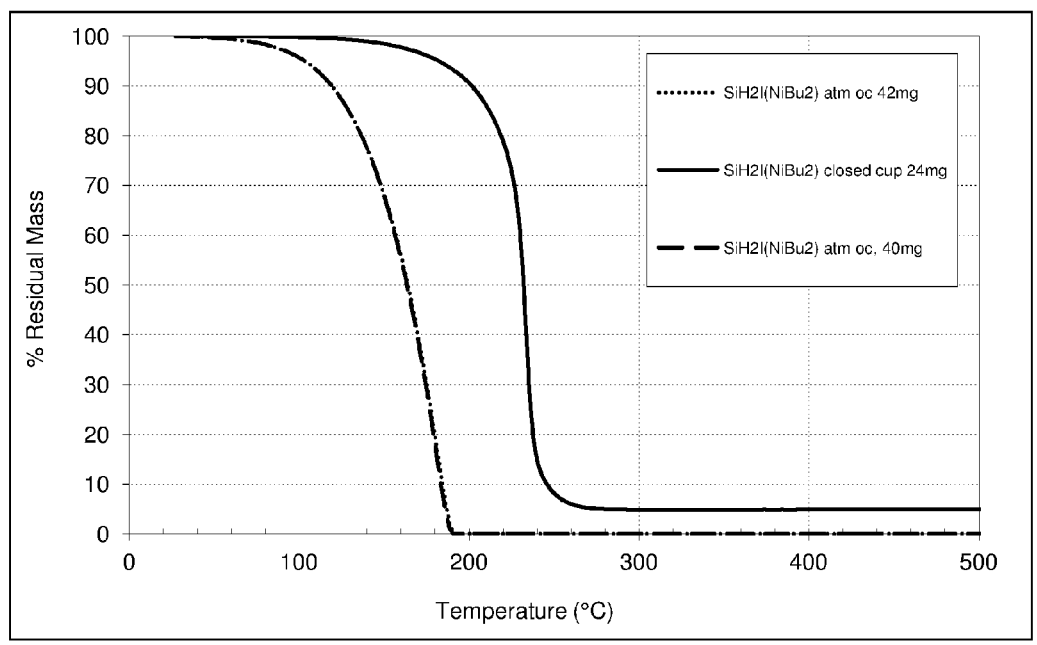
FIG. 6 is a TGA graph demonstrating the percentage of weight loss with increasing temperature of $SiH_2I(N^iBu_2)$.

FIG. 6 shows distilled SiH$_2$I(N(iBu)$_2$) TGA data. As shown, the open cup TGA shows clean evaporation and low (<1%) residue for SiH$_2$I(N(iBu)$_2$) both before and after 8 hour thermal test @ 70° C. The closed cup TGA shows slightly higher residue (approximately 4%).

The properties of SiH$_2$I(N(iBu)$_2$) are as follows.
Distilled SiH$_2$I(N(iBu)$_2$) Vapor Pressure=1 Torr @ 29° C.
MP=<−70° C.
$^1$H & $^{29}$Si NMR confirms GCMS shows single product SiH$_2$I(N(iBu)$_2$).
$^{13}$C NMR confirms GCMS shows single product SiH$_2$I(N(iBu)$_2$).
Purity (GCMS & $^1$H NMR) >99%.
Density=1.28 g/mL @ 24° C.
Viscosity=1.79 cSt @ 24° C.

Example 3

Stability

Figure 7:
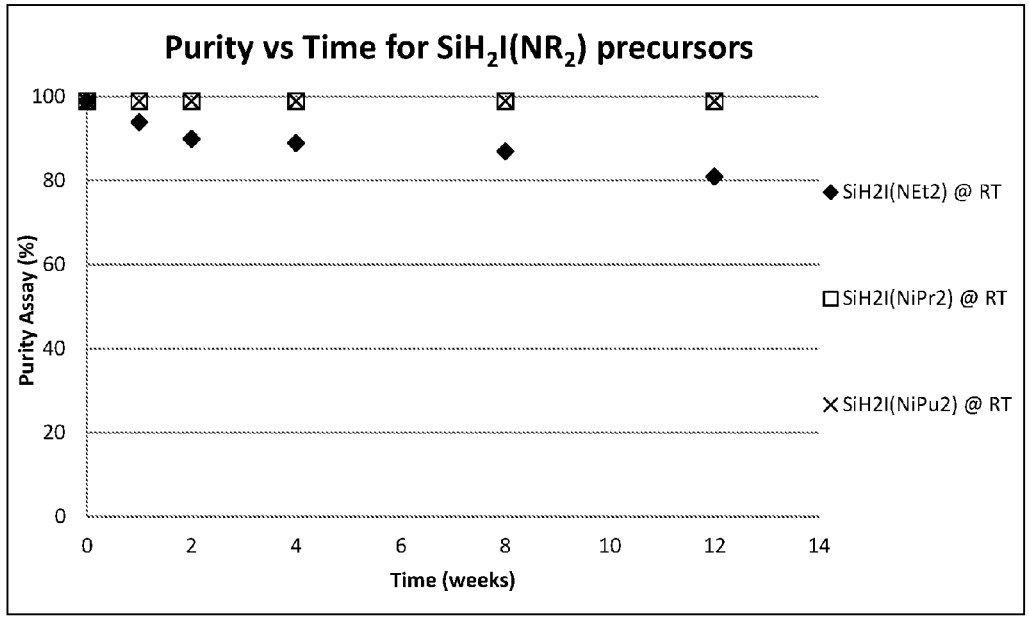
FIG. 7 is a graph demonstrating the purity over time for the precursors included in Examples 1-3 stored at 24° C.
Figure 8:
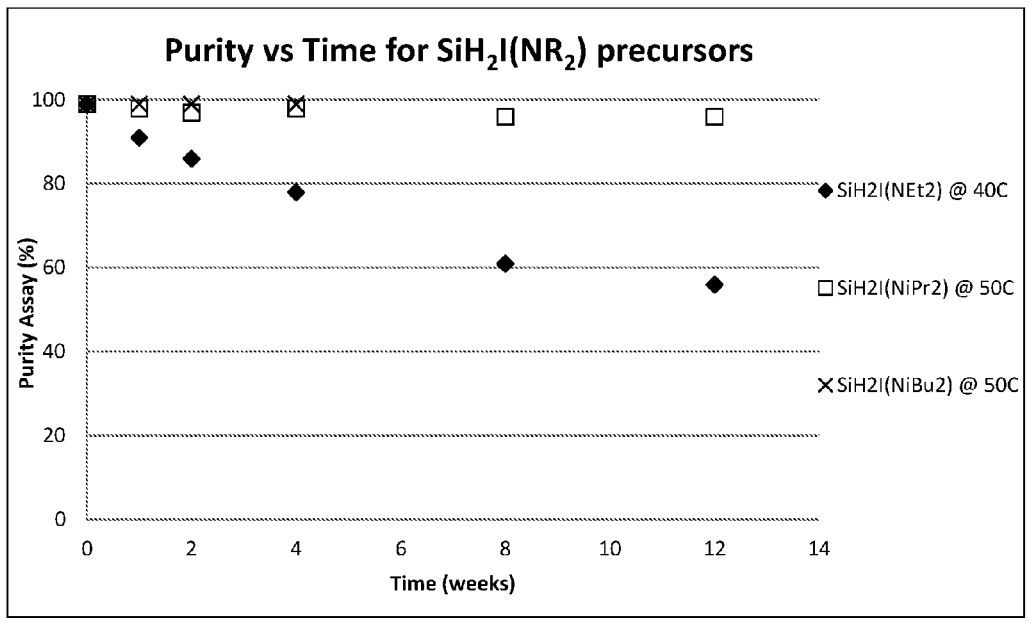
FIG. 8 is a graph demonstrating the purity over time for the precursors included in Examples 1-3 stored at 40° C. ($SiH_2I(NEt_2)$) and 50° C. ($SiH_2I(N^iPr_2)$ and $SiH_2I(N^iBu_2)$)

FIG. 7 is a graph showing purity over time for the precursors included in Examples 1 and 2 and Comparative Example 3 stored at 24° C. FIG. 8 is a graph showing purity over time for the precursors included in Examples 1 and 2 and Comparative Example 3 stored at 40° C. (SiH$_2$I(NEt$_2$)) and 50° C. (SiH$_2$I(N$^i$Pr$_2$) and SiH$_2$I(N$^i$Bu$_2$)). The purity was determined by Gas Chromatography/Mass Spectrometry.

As shown in FIG. 7, after 12 weeks at room temperature, the purities of SiH$_2$I(N(iBu)$_2$) and SiH$_2$I(N(iPr)$_2$) decrease approximately 1% and 4% respectively, while the purity of SiH$_2$I(NEt$_2$) decreases 19%. FIG. 8 demonstrates that the purity of SiH$_2$I(NEt$_2$) decreases even more at 40° C., 44% at 12 weeks. In contrast, (SiH$_2$I(N$^i$Pr$_2$)) decreases 2% after 4 weeks and 4% after 12 weeks at 50° C. SiH$_2$I(N$^i$Bu$_2$)) decreases only 1% after 4 weeks at 50° C. Insufficient material was available to provide further data points for SiH$_2$I(N$^i$Bu$_2$)). FIGS. 7 and 8 demonstrate that SiH$_2$I(N(iBu)$_2$) has better thermal stability over time at a broad temperature range, for example, ranging from room temperature to 50° C.

Example 4

Deposition Using SiH$_2$I(N$^i$Bu$_2$)

PEALD test were performed using SiH$_2$I(N$^i$Bu$_2$) which was placed in a bubbler at room temperature (approx. 23° C.). Typical PEALD conditions were used, such as using nitrogen direct plasma with excitation frequency at 13.56 Mhz, and reactor pressure fixed at 1 Torr. Wafer temperature was measured at 250° C. and deposition was performed on pure silicon wafers.

Figure 9:
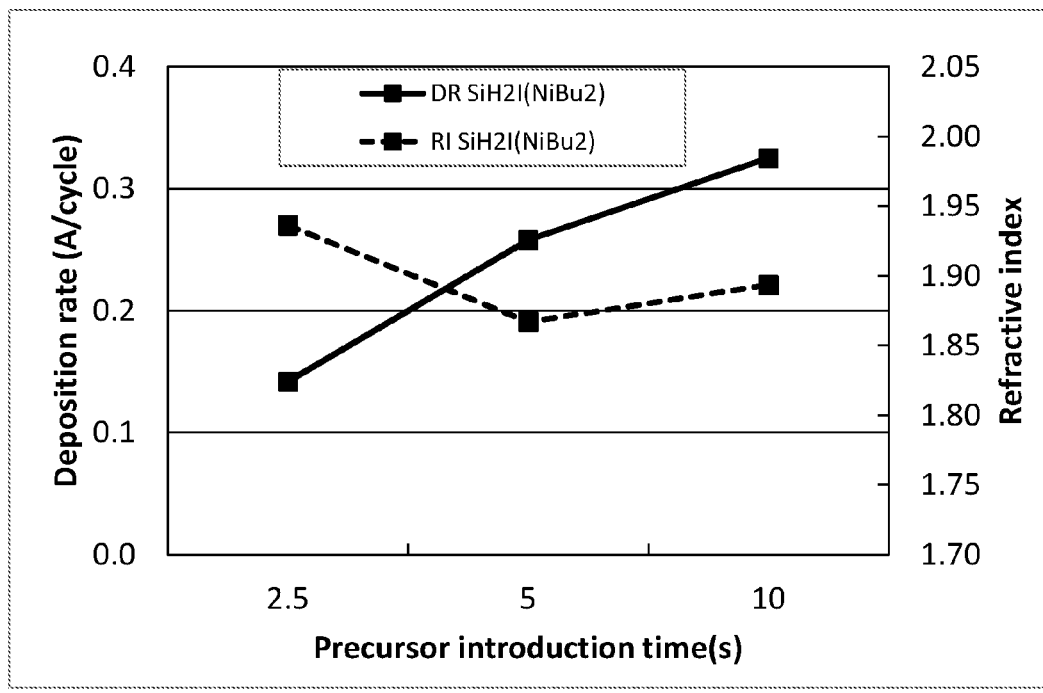
FIG. 9 is a graph showing the deposition rate and refractive index of silicon nitride films from $SiH_2I(N^iBu_2)$ and plasma $N_2$ as a function of the precursor introduction pulse time in seconds.

FIG. 9 is a graph showing the deposition rate and refractive index as a function of the precursor introduction pulse time in seconds. As illustrated in FIG. 9, initial R&D testing did not produce the typical ALD saturation plateau that results from substrate saturation. The film properties below were obtained from a 5 second precursor pulse, 10 second N$_2$ purge, 7 second N$_2$ plasma pulse at 200 W, and 3 second N$_2$ purge.

The refractive index values are characteristics of SiN film (1.9-2.0). The film wet etch rate (WER) was obtained using 0.1% HF diluted solution. The WER of was measured at 96 Å/min.

XPS analysis of the resulting 193 Å thick film shows a Si-rich film having very low iodine contamination as follows: Si of 48.9 atomic % (at %), N of 38.3 at %, O of 3.2 at %, C of 9.4 at %, and I of 0.2 at %. This analysis was performed on the uncapped film at a R&D facility, therefore the oxygen concentration may be due to post deposition air exposure. One of ordinary skill in the art will recognize that these initial R&D results are promising and that optimization of the PEALD process may further improve these results.

Example 5

Deposition Using SiH$_2$I(N$^i$Pr$_2$)

PEALD test were performed using SiH$_2$I(N$^i$Pr$_2$) which was placed in a bubbler at room temperature (approx. 23° C.). Typical PEALD conditions were used, such as using nitrogen direct plasma with excitation frequency at 13.56 Mhz, and reactor pressure fixed at 1 Torr. Wafer temperature was measured at 250° C. and deposition was performed on pure silicon wafers.

Figure 10:
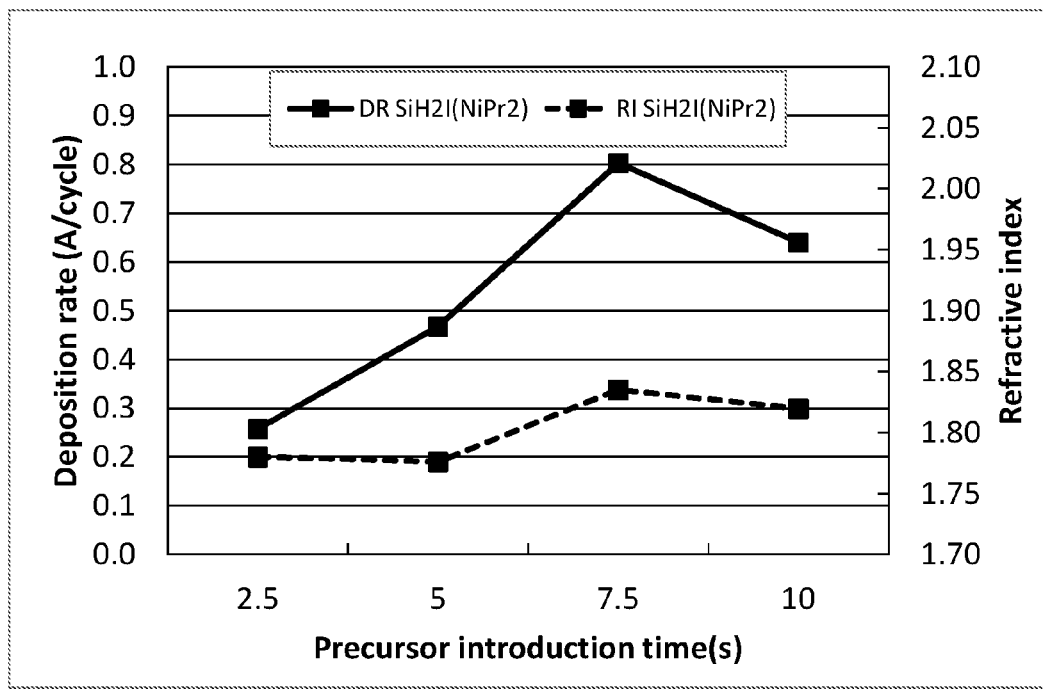
FIG. 10 is a graph showing the deposition rate and refractive index of silicon nitride films from $SiH_2I(N^iPr_2)$ and plasma $N_2$ as a function of the precursor introduction pulse time in seconds.

FIG. 10 is a graph showing the deposition rate and refractive index as a function of the precursor introduction pulse time in seconds. As illustrated in FIG. 10, initial R&D testing did not produce the typical ALD saturation plateau that results from substrate saturation, but testing remains ongoing. However, as the analysis below reveals, the resulting silicon nitride films have properties that may be suitable for commercial applications. More particularly, the 0.8 Å/cycle deposition rate and 1 Å/minute wet etch rate may be suitable for applications that require quick deposition of sacrificial silicon nitride films. The film properties below were obtained from a 7.5 second precursor pulse, 5 second N$_2$ purge, 7 second N$_2$ plasma pulse at 200 W, and 3 second N$_2$ purge. The refractive index values are on the low end of typical SiN film values (1.9-2.0). The film wet etch rate (WER) was obtained using 0.1% HF diluted solution. The WER was measured at 102 Å/min.

XPS analysis of the resulting 542 Å thick film shows a Si-rich film as follows: Si of 48.8 at %, N of 42.2 at %, O of 1.2 at %, C of 7.7 at %, and I of 0.1 at %. This analysis was performed on the uncapped film at a R&D facility, therefore the oxygen concentration may be due to post deposition air exposure.

Comparative Example 6

Deposition Using $SiH_2Cl(N^iPr_2)$

PEALD test were performed using $SiH_2Cl(N^iPr_2)$ which was placed in a bubbler at room temperature (approx. 23° C.). Typical PEALD conditions were used, such as using nitrogen direct plasma with excitation frequency at 13.56 Mhz, and reactor pressure fixed at 1 Torr. Wafer temperature was measured at 250° C. and deposition was performed on pure silicon wafers.

Figure 11:
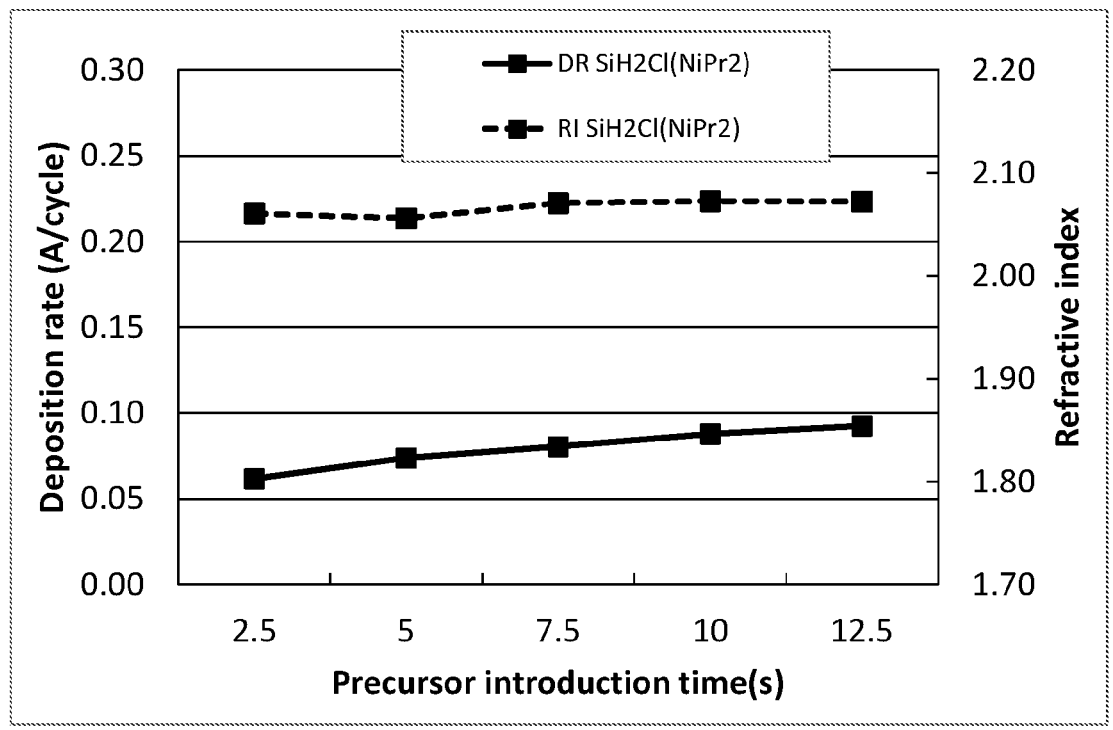
FIG. 11 is a graph showing the deposition rate and refractive index of silicon nitride films from $SiH_2Cl(N^iPr_2)$ and plasma $N_2$ as a function of the precursor introduction pulse time in seconds.

FIG. 11 is a graph showing the deposition rate and refractive index as a function of the precursor introduction pulse time in seconds. As illustrated in FIG. 11, initial R&D testing did not produce the typical ALD saturation plateau that results from substrate saturation, but testing remains ongoing. Additionally, the deposition rate was very slow, making the process unsuitable for commercial applications. The film properties below were obtained from a 10 second precursor pulse, 10 second $N_2$ purge, 7 second $N_2$ plasma pulse at 50 W, 3 second $N_2$ purge. The refractive index values are characteristics of SiN film (1.9-2.0). The film wet etch rate was obtained using 0.1% HF diluted solution. The WER was measured at 6 Å/min.

XPS analysis of the resulting 66 Å thick film shows Si-rich film and no chlorine contamination as follows: Si of 43.5 at. %, N of 47.0 at. %, O of 6.8 at. %, C of 2.7 at. %, and Cl of 0.0 at. %.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

What is claimed is:

1. A method of depositing a sacrificial Silicon nitride layer on a substrate, the method comprising:
   introducing a vapor of $SiH_2I(N(iPr)_2)$ and/or $SiH_2I(N(iBu)_2)$ into a reactor having a substrate disposed therein and depositing at least part of $SiH_2I(N(iPr)_2)$ and/or $SiH_2I(N(iBu)_2)$ onto the substrate;
   introducing a nitrogen-containing reactant into the reactor to form the sacrificial silicon nitride layer at a rate ranging from approximately 0.5 Å/cycle to approximately 1 Å/cycle using a vapor deposition method; and
   removing the sacrificial silicon nitride layer at a rate of approximately 102 Å/minute.

2. The method of claim 1, wherein the vapor deposition method is PEALD.

3. The method of claim 1, wherein the nitrogen-containing reactant is $N_2$.

4. A method of depositing a sacrificial Silicon nitride layer on a substrate, the method comprising:
   introducing a vapor of $SiH_2I(N(iPr)_2)$ and/or $SiH_2I(N(iBu)_2)$ into a reactor having a substrate disposed therein;
   depositing at least part of $SiH_2I(N(iPr)_2)$ and/or $SiH_2I(N(iBu)_2)$ onto the substrate to form the sacrificial silicon nitride layer using a vapor deposition method; and
   removing the sacrificial silicon nitride layer at a rate of approximately 102 Å/minute.

5. The method of claim 4, further comprising introducing a nitrogen-containing reactant into the reactor to react with the $SiH_2I(N(iPr)_2)$ and/or $SiH_2I(N(iBu)_2)$ and form the sacrificial silicon nitride layer.

6. The method of claim 5, wherein the nitrogen-containing reactant is $N_2$.

7. The method of claim 5, wherein the vapor deposition method is PEALD.

* * * * *